(12) United States Patent
Ishii

(10) Patent No.: US 11,823,636 B2
(45) Date of Patent: Nov. 21, 2023

(54) ARRAY SUBSTRATE, DISPLAY DEVICE AND DRIVING METHOD THEREOF

(71) Applicant: Japan Display Inc., Tokyo (JP)

(72) Inventor: Tatsuya Ishii, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/525,347

(22) Filed: Nov. 12, 2021

(65) Prior Publication Data

US 2022/0157268 A1 May 19, 2022

(30) Foreign Application Priority Data

Nov. 13, 2020 (JP) .................................. 2020-189652

(51) Int. Cl.
*G09G 3/36* (2006.01)
*G09G 3/3266* (2016.01)
(Continued)

(52) U.S. Cl.
CPC ............. *G09G 3/36* (2013.01); *G09G 3/3258* (2013.01); *G09G 3/3266* (2013.01);
(Continued)

(58) Field of Classification Search
CPC ..... G06F 3/038; G06F 3/0412; G09G 3/3614; G09G 3/3648; G09G 2300/0426; G09G 3/3677; G09G 2310/0251; G09G 2310/06; G09G 2310/02; G09G 2310/0254; G09G 2310/0205; G09G 3/3674; G09G 3/36; G09G 3/3658; G09G 3/3266; G09G 3/3659; G09G 3/3688; G09G 3/3685; G09G 3/3233; G09G 2310/0202; G09G 2310/0248; G09G 2300/0895; G09G 2300/026; G09G 2300/0439; G09G 2300/0866; G09G 2300/0842; G02F 1/136286; G02F 1/133345; G02F 1/133514; G02F 1/136222; G02F 1/13629; G02F 1/1368; H10K 59/13; H10K 59/1213;
(Continued)

(56) References Cited

U.S. PATENT DOCUMENTS 10,269,831 B2 * 4/2019 Saitoh ................... H01L 27/124
10,755,643 B2 * 8/2020 Yoshida ............... G09G 3/3291
(Continued)

FOREIGN PATENT DOCUMENTS

JP 2012181396 A 9/2012

*Primary Examiner* — Dismery Mercedes
(74) *Attorney, Agent, or Firm* — K&L Gates LLP

(57) ABSTRACT

A display device includes a display unit including a plurality of pixels, a first drive circuit supplying a gate voltage to drive the plurality of pixels, a gate line connected to the plurality of pixels and the first drive circuit, the gate line transmitting the gate voltage to the plurality of pixels, a second drive circuit supplying a drive voltage corresponding to a luminance of each of the plurality of pixels, a data line connected to the plurality of pixels and the second drive circuit, the data line transmitting the drive voltage to the plurality of pixels, a back gate circuit generating a back gate voltage having a reverse polarity of the gate voltage, and a back gate line extending parallel to the gate line, the back gate line transmitting the back gate voltage to the plurality of pixels.

6 Claims, 21 Drawing Sheets

(51) Int. Cl.
    *H01L 27/12*           (2006.01)
    *G09G 3/3258*        (2016.01)
    *H01L 29/786*       (2006.01)

(52) U.S. Cl.
    CPC ......... *G09G 3/3614* (2013.01); *G09G 3/3648* (2013.01); *G09G 3/3674* (2013.01); *H01L 27/124* (2013.01); *H01L 27/1214* (2013.01); *G09G 2300/0842* (2013.01); *G09G 2300/0866* (2013.01); *G09G 2310/0286* (2013.01); *G09G 2310/08* (2013.01); *G09G 2320/0214* (2013.01); *G09G 2320/0247* (2013.01); *H01L 29/78648* (2013.01)

(58) Field of Classification Search
    CPC ........... H01L 29/7869; H01L 29/78648; H01L 29/4908; H01L 27/124; H01L 27/12
    See application file for complete search history.

(56) References Cited

U.S. PATENT DOCUMENTS

| | | | |
|---|---|---|---|
| 11,030,945 B2* | 6/2021 | Bae | G09G 3/32 |
| 11,062,656 B2* | 7/2021 | Lee | G09G 3/3258 |
| 2011/0102409 A1* | 5/2011 | Hayakawa | G09G 3/3674 |
| | | | 345/212 |
| 2011/0122324 A1* | 5/2011 | Yamashita | G09G 3/3233 |
| | | | 348/739 |
| 2012/0058598 A1* | 3/2012 | Yamazaki | H01L 29/78603 |
| | | | 257/E21.459 |
| 2012/0169798 A1* | 7/2012 | Ebisuno | G09G 3/325 |
| | | | 345/77 |
| 2012/0223876 A1 | 9/2012 | Kitazawa et al. | |
| 2013/0207102 A1* | 8/2013 | Miyake | H01L 29/42384 |
| | | | 257/43 |
| 2014/0014955 A1* | 1/2014 | Saito | H01L 29/788 |
| | | | 257/43 |
| 2014/0139775 A1* | 5/2014 | Miyake | H01L 29/78648 |
| | | | 257/43 |
| 2015/0255018 A1* | 9/2015 | Aoki | G09G 3/20 |
| | | | 345/76 |
| 2017/0162602 A1* | 6/2017 | Saitoh | H01L 29/24 |
| 2019/0259822 A1* | 8/2019 | Jeon | H01L 27/1218 |
| 2020/0118506 A1* | 4/2020 | Yamamoto | G09F 9/30 |
| 2020/0312230 A1* | 10/2020 | Bae | G09G 3/3233 |
| 2022/0102422 A1* | 3/2022 | Lee | H01L 33/38 |

* cited by examiner

ARRAY SUBSTRATE, DISPLAY DEVICE AND DRIVING METHOD THEREOF

CROSS REFERENCE TO RELATED APPLICATIONS

This application is based on and claims the benefit of priority from the prior Japanese Patent Application No. 2020-189652, filed on Nov. 13, 2020, the entire contents of which are incorporated herein by reference.

FIELD

One of the embodiments of the present disclosure relates to a display device and driving method thereof.

BACKGROUND

At present, the most widely used display device includes a liquid crystal display device and an organic electroluminescence display device (hereinafter referred to as an organic EL display device). The liquid crystal display device and the organic EL display device are widely used as interfaces for various electronic devices such as televisions, computers, tablets, smartphones, and the like.

In a liquid crystal display device of the active-matrix type, a thin film transistor (TFT) provided in each pixel is turned on/off for each row by a gate voltage applied from a gate line drive circuit. When the TFT is on, a data voltage applied from a data line drive circuit is applied to a pixel electrode, and a voltage corresponding to the potential difference between the pixel electrode and a common electrode facing the pixel electrode is applied to a liquid crystal layer. After the TFT is turned off, an image is displayed in one frame period by continuously applying a voltage to the liquid crystal layer by a storage capacitor which retains charges.

A liquid crystal contained in the liquid crystal layer changes its physical properties and deteriorates when a DC voltage is continuously applied for a long time. Therefore, from the viewpoint of extending the life of a liquid crystal panel containing the liquid crystal layer, an AC voltage driving is performed by applying an AC voltage to the liquid crystal layer by inverting the polarity of the data voltage with respect to the common voltage applied to a counter electrode. In the AC voltage driving, a frame inversion method which inverts the polarity of the data voltage every one frame period is adopted.

In a case where the AC voltage driving is performed by the frame inversion method, during the on-period of the TFT, the parasitic capacitance occurred between a gate electrode and a source electrode or between the gate electrode and a drain electrode of the TFT causes a feedthrough in which the level of the voltage applied to the pixel electrode is shifted. If the magnitude of the voltage shifted between frames differs, the voltage applied to the pixel electrode varies between frames, resulting in flickers in the image displayed on the liquid crystal panel and degrading the display quality.

Similar to the liquid crystal display device, the organic EL display device also includes the TFT as a switching element of a pixel circuit, and the storage capacitor for holding a video signal applied to the pixel from a drive circuit. Even in the case of the organic EL display device, during the on-period of the TFT, the parasitic capacitance between the gate electrode and the source electrode or between the gate electrode and the drain electrode of the TFT causes a feedthrough in which the voltage held in the storage capacitor is shifted, resulting in a change in the brightness of the displayed image.

Japanese laid-open patent publication No. 2012-181396 discloses a technique for canceling a shift in a voltage due to feedthrough by inverting the polarity of the gate signal supplied to the gate line by an inverter to generate an inverted signal and supplying the inverted signal to an inverted gate line.

SUMMARY

A display device according to an embodiment includes a display unit including a plurality of pixels, a first drive circuit supplying a gate voltage to drive the plurality of pixels, a gate line connected to the plurality of pixels and the first drive circuit, the gate line transmitting the gate voltage to the plurality of pixels, a second drive circuit supplying a drive voltage corresponding to a luminance of the pixel, a data line connected to the plurality of pixels and the second drive circuit, the data line transmitting the drive voltage to the plurality of pixels, a back gate circuit generating a back gate voltage having a reverse polarity of the gate voltage, and a back gate line extending parallel to the gate line, and the back gate line transmitting the back gate voltage to the plurality of pixels.

A driving method for a display device according to an embodiment includes a display unit including a plurality of pixels, a gate line connected to the plurality of pixels and transmitting a gate voltage to the plurality of pixels, a data line supplying a drive voltage to the plurality of pixels, and a back gate line extending parallel to the gate line and supplying a back gate voltage having a reverse polarity of the gate voltage to the plurality of pixels, wherein the driving method includes supplying the back gate voltage to the back gate line at the timing when the gate voltage drops from a high level to a low level.

An array substrate for a display device according to an embodiment includes a display area including a plurality of pixels, a peripheral area surrounding the display area, a first drive circuit arranged in the peripheral area, the first drive circuit supplying a gate voltage to drive the plurality of pixels, a gate line arranged in the display area, the gate line connected to the plurality of pixels and the first drive circuit, the gate line transmitting the gate voltage to the plurality of pixels, a second drive circuit arranged in the peripheral area, the second drive circuit supplying a drive voltage corresponding to a luminance of the pixel, a data line arranged in the display area, the data line connected to the plurality of pixels and the second drive circuit, the data line transmitting the drive voltage to the plurality of pixels, a back gate circuit arranged in the peripheral area, the back gate circuit generating a back gate voltage having a reverse polarity of the gate voltage, and a back gate line arranged in the display area, the back gate line extending parallel to the gate line, the back gate line transmitting the back gate voltage to the plurality of pixels.

DESCRIPTION OF EMBODIMENTS

Figure 1:
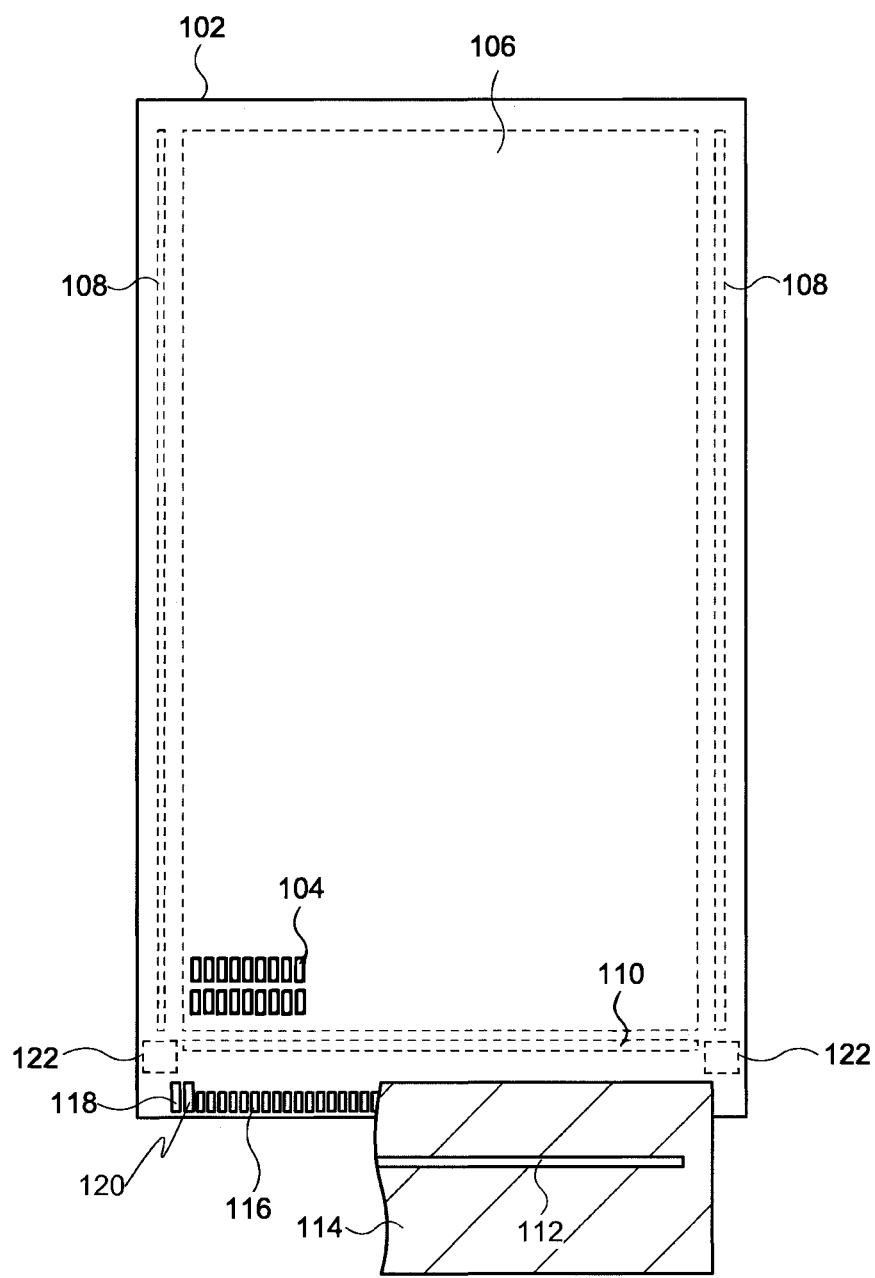
FIG. 1 is a schematic view showing an example of a configuration of a display device according to an embodiment.

In Japanese laid-open patent publication No. 2012-181396, since an inverted gate line for supplying an inverted signal is newly provided, there is a problem that it is difficult to achieve high definition. In addition, in a case where an inverted gate line is arranged on a liquid crystal panel, providing the inverted gate line at a position close to a TFT may cause a problem in turning the TFT on/off. Therefore, the inverted gate line must be provided at a position away from the TFT, therefore, it is difficult to achieve high definition and high opening ratio.

In view of these problems, it is an object of an embodiment of the present disclosure to provide a display device capable of achieving high definition and high opening ratio while preventing feedthrough. Another object of an embodiment of the present disclosure is to provide a driving method of a display device capable of achieving high definition and high opening ratio while preventing feedthrough.

Embodiments of the present disclosure will be described below with reference to the drawings and the like. However, the present disclosure can be implemented in various mode without departing from the gist thereof and should not be construed as being limited to the description of the following exemplary embodiments.

The drawings may be schematically represented in terms of width, thickness, shape, and the like of each part as compared with actual embodiments for the sake of clarity of description but are merely an example and do not limit the interpretation of the present disclosure. In this specification and each of the drawings, components having the same functions as those described with reference to the preceding drawings are denoted by the same reference numerals, and a duplicate description thereof may be omitted.

In the present specification and claims, in a case where a single film is processed to form a plurality of films, the plurality of films may have different functions and roles. However, the plurality of films is derived from films formed as the same layer in the same process and are the same material. Therefore, the plurality of films is defined as being present in the same layer.

In the present specification and claims, the expression "above" merely includes the case of arranging another structure on a structure, the case of arranging another structure directly above a structure, and the case of arranging another structure above a structure via another structure, unless otherwise specified.

First Embodiment

<Configuration of Display Device>

A configuration of a display device according to an embodiment will be described. Here, as an example, illustrating a case where a display device according to an embodiment is a liquid crystal display device of a transverse electric field system including an IPS system and an FFS system.

FIG. 1 is a schematic view showing an example of a configuration of a display device 100 according to the first embodiment. The display device 100 has a substrate 102 and has various insulating layers, semiconductor layers, and conductive layers patterned thereon. These insulating layer, semiconductor layer, and conductive layer provide a plurality of pixels 104 and a drive circuit for driving the plurality of pixels 104. The drive circuit includes a gate line drive circuit (first drive circuit) 108, a data line drive circuit (second drive circuit) 110, and a back gate voltage generation circuit (back gate circuit) 122 which will be described later. The plurality of pixels 104 is arranged periodically, by which a display area 106 is defined. A liquid crystal element 200 is provided for each pixel 104.

The gate line drive circuit 108, the data line drive circuit 110, and the back gate circuit 122 are arranged in a peripheral area surrounding the display area 106. Various wirings (not shown) formed of a patterned conductive film extend from the display area 106, the gate line drive circuit 108, the data line drive circuit 110, and the back gate circuit 122 to one side of the substrate 102. These wirings are exposed near the end of the substrate 102 to form terminals such as signal terminals 116, power supply terminals 118, 120, and the like. These terminals are electrically connected to a flexible printed circuit board (FPC) 114.

In the present embodiment, a drive IC 112 having an integrated circuit formed on a semiconductor substrate is mounted on the FPC 114. Various signals required for driving the pixel 104 such as an image signal, a clock signal, a horizontal synchronization signal, and a vertical synchronization signal are supplied from the external circuit via the drive IC 112 and the FPC 114 (not shown). These signals are supplied to the gate line drive circuit 108, the data line drive circuit 110, and the back gate circuit 122 via the signal terminals 116.

<Pixel Configuration>

Figure 2:
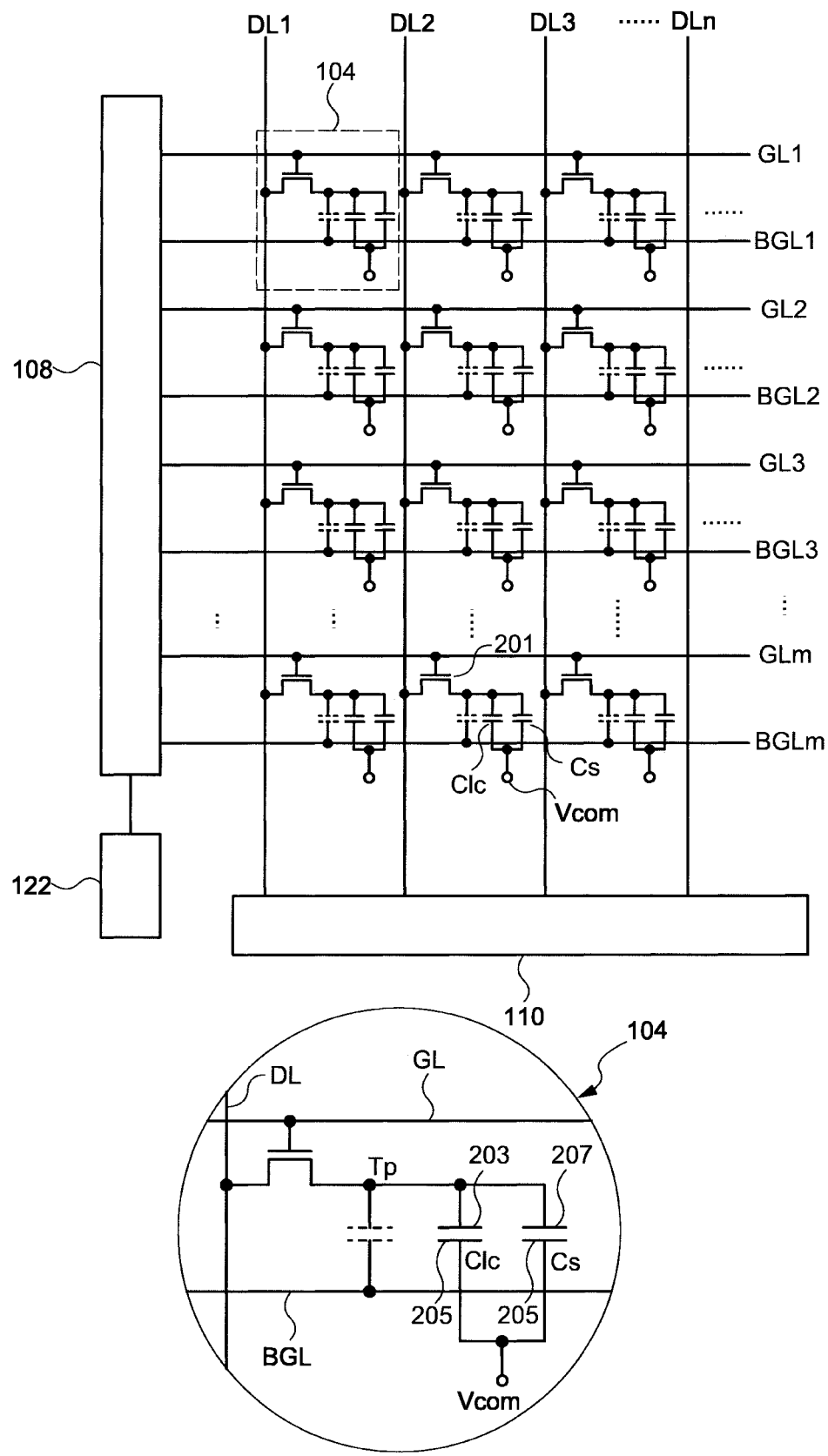
FIG. 2 is a schematic view showing an equivalent circuit of a pixel of a display device and an enlarged view of the equivalent circuit of the pixel.

A configuration of the pixel 104 will be described with reference to FIG. 2. FIG. 2 is a schematic view showing an equivalent circuit of the pixel 104 and an enlarged view of the pixel 104. The pixel 104 includes a switching element 201, a liquid crystal capacitance Clc, and a storage capacitance Cs. One end of the liquid crystal capacitance Clc is a pixel electrode 203, the other end is a common electrode 205 to which a common voltage Vcom is applied.

In this embodiment, the switching element 201 is a thin film transistor (TFT). A gate electrode of the switching element 201 is connected to a gate line GL (GL1 to GLm; m is an integer of 1 or more) and a gate voltage is supplied via the gate line GL. One of the source electrode and the drain electrode of the switching element 201 is connected to a data line DL (DL1 to DLn; n is an integer of 1 or more) to which an image signal is supplied. The other of the source electrode and the drain electrode is electrically connected to the pixel electrode 203. When the switching element 201 is turned on, the image signal is supplied to the pixel electrode 203. A voltage corresponding to the potential difference between a pixel voltage corresponding to the image signal applied to the pixel electrode 203 and the common voltage applied to the common electrode 205 is supplied to the liquid crystal capacitance Clc.

A back gate line BGL (BGL1 to BGLm) is supplied with a back gate voltage. The back gate voltage has potential in a reverse phase (reverse polarity) of the gate voltage supplied to the gate line GL. A detailed description of the back gate voltage will be described later. The back gate line BGL (BGL1 to BGLm) corresponds to the gate line GL (GL1 to GLm), respectively. The back gate line BGL is at least partially overlapped with the corresponding gate line GL. Further, the back gate line BGL is arranged between the substrate 102 and the gate line GL.

Figure 3:
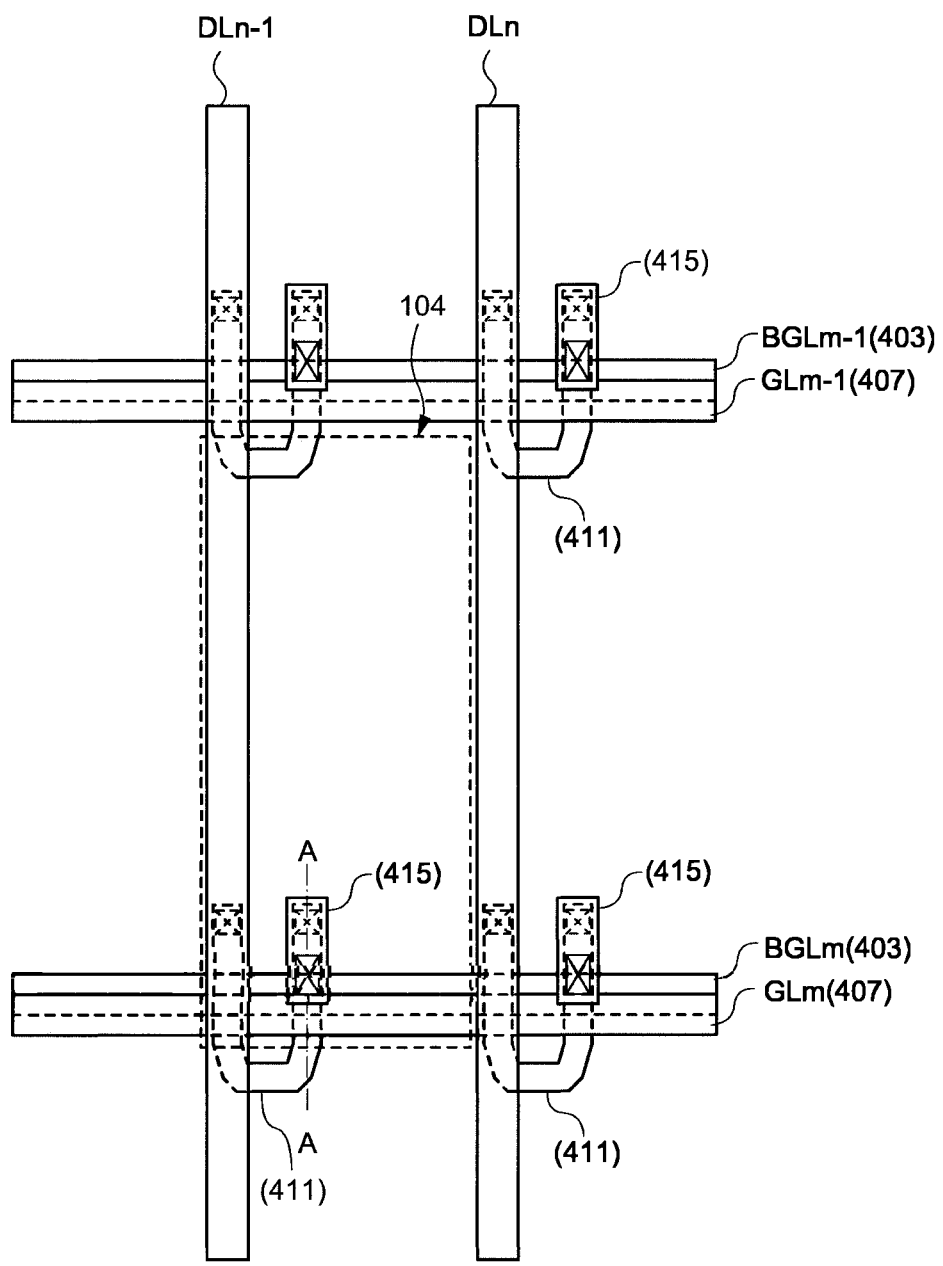
FIG. 3 is a plan view showing an example of a pixel layout.
Figure 4:
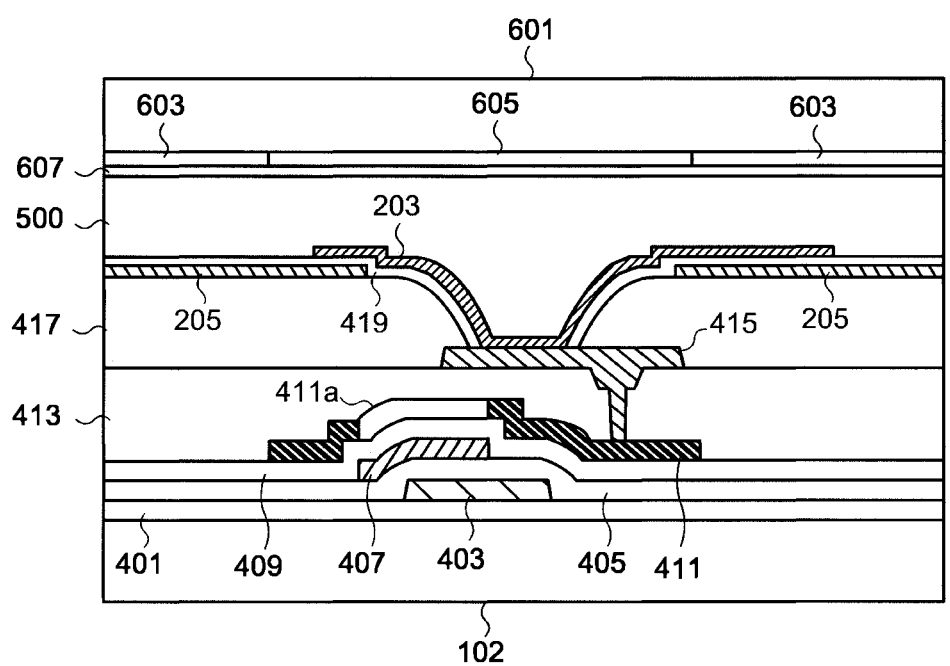
FIG. 4 is cross-sectional view of a display device along A-A line in FIG. 3.

FIG. 3 is a plan view showing an example of a layout of the pixel 104. FIG. 4 is a cross-sectional view of the display device 100 along A-A line in FIG. 3. In FIG. 3, for clarity of the layout, the pixel electrode 203 and the common electrode 205 are omitted. The symbols in parentheses in FIG. 3 correspond to the symbols shown in FIG. 4.

Referring to FIG. 4, a base layer 401 is arranged on the substrate 102. The substrate 102 may be a glass substrate. The base layer 401 is, for example, an insulating film formed of a silicon oxide ($SiO_2$).

A light shielding layer 403 is arranged on the base layer 401. The light shielding layer 403 also serves as the back gate line BGL. The light shielding layer 403 (the back gate line BGL) is extended parallel to the gate line GL, and is provided in common to the pixels 104 of each row. The light shielding layer 403 is formed of a conductive material. The conductive material used for the light shielding layer 403 may be a metal and may include, for example, Cu, Al, W, Mo, or an alloy thereof.

An insulating layer 405 is arranged on the light shielding layer 403. The insulating layer 405 may be, for example, an insulating film made of a silicon oxide ($SiO_2$). A gate electrode 407 is arranged on the insulating layer 405. The gate electrode 407 also serves as the gate line GL. A gate electrode 105 is formed of a metal. For example, the gate electrode 407 includes a Mo alloy and an Al alloy, and it may be made of a stacked body of the Mo alloy and the Al alloy.

A gate insulating film 409 is arranged on the gate electrode 407. The gate insulating film 409 includes, for example, a silicon oxide ($SiO_2$). A semiconductor layer 411 is arranged on the gate insulating film 409. The semiconductor layer 411 may be amorphous silicon (a-Si:H), but it is preferably formed of polysilicon (poly-Si) with a TFT of a drive circuit to be described later.

An interlayer insulating layer 413 is arranged on the semiconductor layer 411. The interlayer insulating layer 413 includes, for example, a silicon oxide ($SiO_2$). A conductive layer 415 is arranged on the interlayer insulating layer 413. The conductive layer 415 includes a metal and may include, for example, Cu, Al, W, Mo, or an alloy thereof. The conductive layer 415 is connected to the semiconductor layer 411 via a contact hole arranged in the interlayer insulating layer 413. The gate electrode 407, the gate insulating film 409, the semiconductor layer 411, and the conductive layer 415 form the TFT which is the switching element 201. In this case, the TFT is a bottom-gate type TFT. The conductive layer 415 corresponds to one of the source electrode and the drain electrode of the TFT. In the present embodiment, the TFT is not limited to the bottom-gate type, it may be a top-gate type TFT. Although not shown in FIG. 4, a conductive layer, which is connected to the data line DL and serves as the other of the source electrode and the drain electrode of the TFT, is also arranged in the same layer as the conductive layer 415. The data line DL may be arranged in the same layer as the conductive layer 415.

As shown in FIG. 4, at least a part of the conductive layer 415, i.e., one of the source electrode and the drain electrode of the TFT is overlapped with the light shielding layer 403 described above. The light shielding layer 403 faces a channel layer 411a of the semiconductor layer 411 via the gate electrode 407. As shown in FIG. 4, the light shielding layer 403 faces at least one end of the gate electrode 407, which defines the channel layer 411a with the other end of the gate electrode 407. The light shielding layer 403 may be arranged to overlap the entire semiconductor layer 411 via the gate electrode 407. As shown in FIG. 4, the light shielding layer 403 faces at least a part of the conductive layer 415, i.e., one electrode of the source electrode and the drain electrode of the TFT, but it does not have to overlap completely with the gate electrode 407.

A passivation film 417 is arranged on the conductive layer 415. The passivation film 417 may be an organic film made of an organic material. As the organic material, an acrylic resin, a silicone resin, an epoxy resin, a polyimide resin, or the like can be used. The passivation film 417 serves as a planarization film. The passivation film 417 is provided with a contact hole that exposes at least a part of the conductive layer 415.

The common electrode 205 is arranged on the passivation film 417 except for the periphery of the contact hole arranged in the passivation film 417. The common electrode 205 includes a transparent conductive material, and may include, for example, ITO or IZO. A capacitance insulating film 419 is arranged on the common electrode 205. The capacitance insulating film 419 may include, for example, a silicon nitride ($SixNy$). The capacitance insulating film 419 forms the storage capacitance Cs between the common electrode 205 and the pixel electrode 203 to be described later. The capacitance insulating film 419 is provided with a contact hole that exposes at least a part of the conductive layer 415.

The pixel electrode 203 is arranged on the capacitance insulating film 419. The pixel electrode 203 includes a transparent conductive material, and may include, for example, ITO or IZO. The pixel electrode 203 is electrically connected to the conductive layer 415 via a hole of the common electrode 205 and the contact hole arranged in the capacitance insulating film 419 and the passivation film 417.

As FIG. 4 shows, a contact portion of the conductive layer 415 with the pixel electrode 203 overlaps with at least part of the light shielding layer 403. The contact portion also overlaps with at least part of the gate electrode 407, so the gate electrode 407 and the channel layer 411a of the semiconductor layer 411 are provided between the contact portion and the light shielding layer 403.

Although not shown in FIG. 4, an alignment film for orienting the liquid crystal molecules is arranged on the pixel electrode 203 and the capacitance insulating film 419 facing a counter substrate 601 to be described later. The structure from the substrate 102 to the alignment film arranged on the pixel electrode 203 and the capacitance insulating film 419 may be referred to as an array substrate.

The counter substrate 601 faces the substrate 102. A color filter 603 is arranged on a surface of the counter substrate 601 facing the substrate 102. The color filter 603 is provided with red, green, and blue color filters for each pixel 104, thereby displaying a color image. A black matrix 605 is arranged between the color filter 603 and the color filter 603. An overcoat film 607 is arranged on the color filter 603 and the black matrix 605.

A liquid crystal layer 500 is arranged between the substrate 102 and the counter substrate 601. Although not shown in FIG. 4, an alignment film for orienting the liquid crystal is arranged on the overcoat film 607 facing the substrate 102 side. The structure from the counter substrate 601 to the alignment film on the overcoat film 607 may be referred to as a color filter substrate.

<Drive Circuit>

Figure 5:
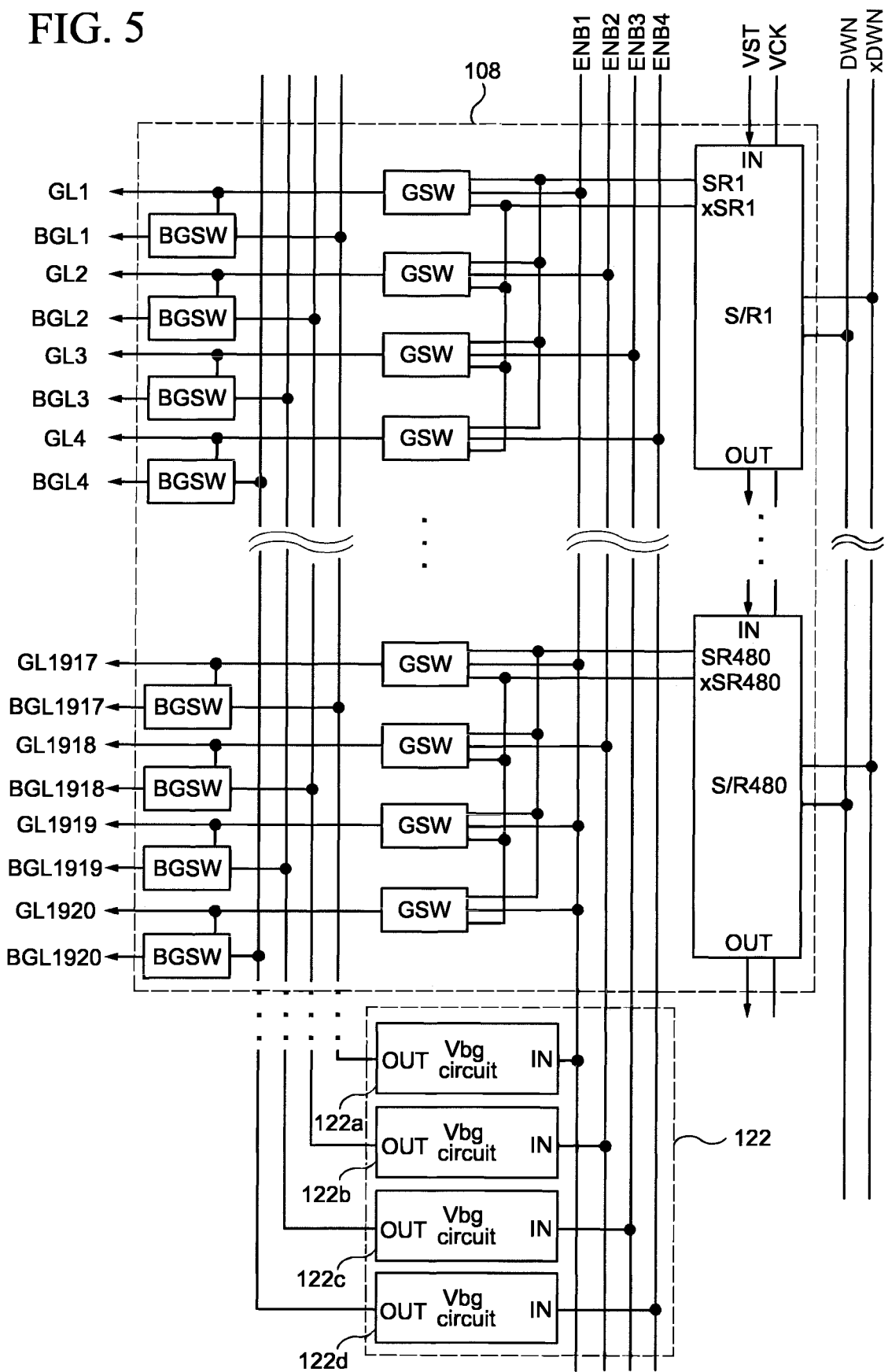
FIG. 5 is a schematic configuration diagram showing an example of a gate line drive circuit and back gate circuit.

FIG. 5 is a schematic configuration diagram showing an example of the gate line drive circuit 108 and the back gate circuit (Vbg circuit) 122. The gate line drive circuit 108 comprises shift registers S/R, a plurality of gate switches (GSW), and back gate switches (BGSW). The back gate circuit 122 may include a plurality of back gate circuits. Here, the case where the back gate circuit 122 includes four back gate circuits (the first back gate circuit 122a to the fourth back gate circuit 122d) will be described, but the number of back gate circuits constituting the back gate circuit 122 corresponds to the number of enable signals. In the present embodiment, the four back gate circuits 122a to 122d are used for the four enable signals.

In the present embodiment, in response to a selection signal SR and an inversion selection signal xSR output from each of the shift resisters S/R, a gate signal is generated from the four enable signal ENB1 to ENB4. The signal SR and the signal xSR are output from each shift resister S/R in synchronization with a gate clock signal VCK. The signal SR and the signal xSR are signals having opposite phases to each other. A gate start pulse VST is input to an input terminal IN of the first stage shift register S/R1. The shift register S/R1 outputs a selection signal SR1 and an inversion selection signal xSR1 in synchronization with the gate clock signal VCK. Further, the shift register S/R1 outputs a start signal from an output terminal OUT to the input terminal IN of the shift register S/R2 of the second stage. The shift register S/R2, upon receiving the start signal from the shift register S/R1, and outputs a signal SR2 and a signal xSR2 in synchronization with the gate clock signal VCK. Similarly, the third-stage shift register S/R3 and subsequent shift registers S/Rn receive the start signal output from the previous stage to its input terminal IN, and outputs the signal SR and the signal xSR in synchronization with the gate clock signal VCK.

Figure 6:
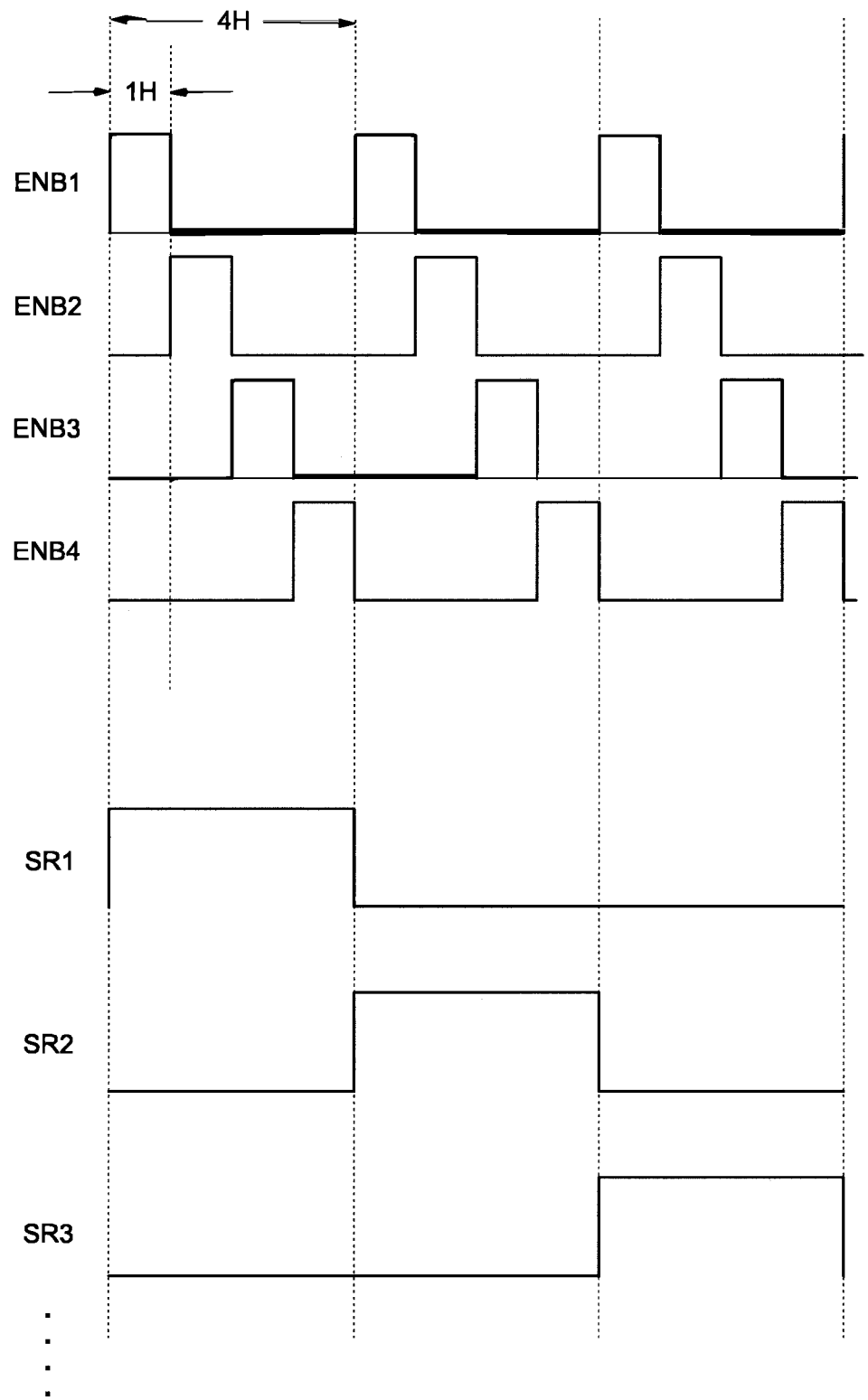
FIG. 6 is a timing chart of enable signals.

FIG. 6 is a timing chart of the four enable signals ENB1 to ENB4. The enable signals ENB correspond to the gate voltage applied to the gate line GL. In the present embodiment, the ENB signals (ENB1 to ENB4) corresponding to four gate lines are applied by shifting the timing every one horizontal period 1H. In other words, in four horizontal periods 4H, the four enable signals ENB1 to ENB4 are selected in order by the shift register S/R, and sequentially supplied to the corresponding gate switch (GSW).

Figure 7:
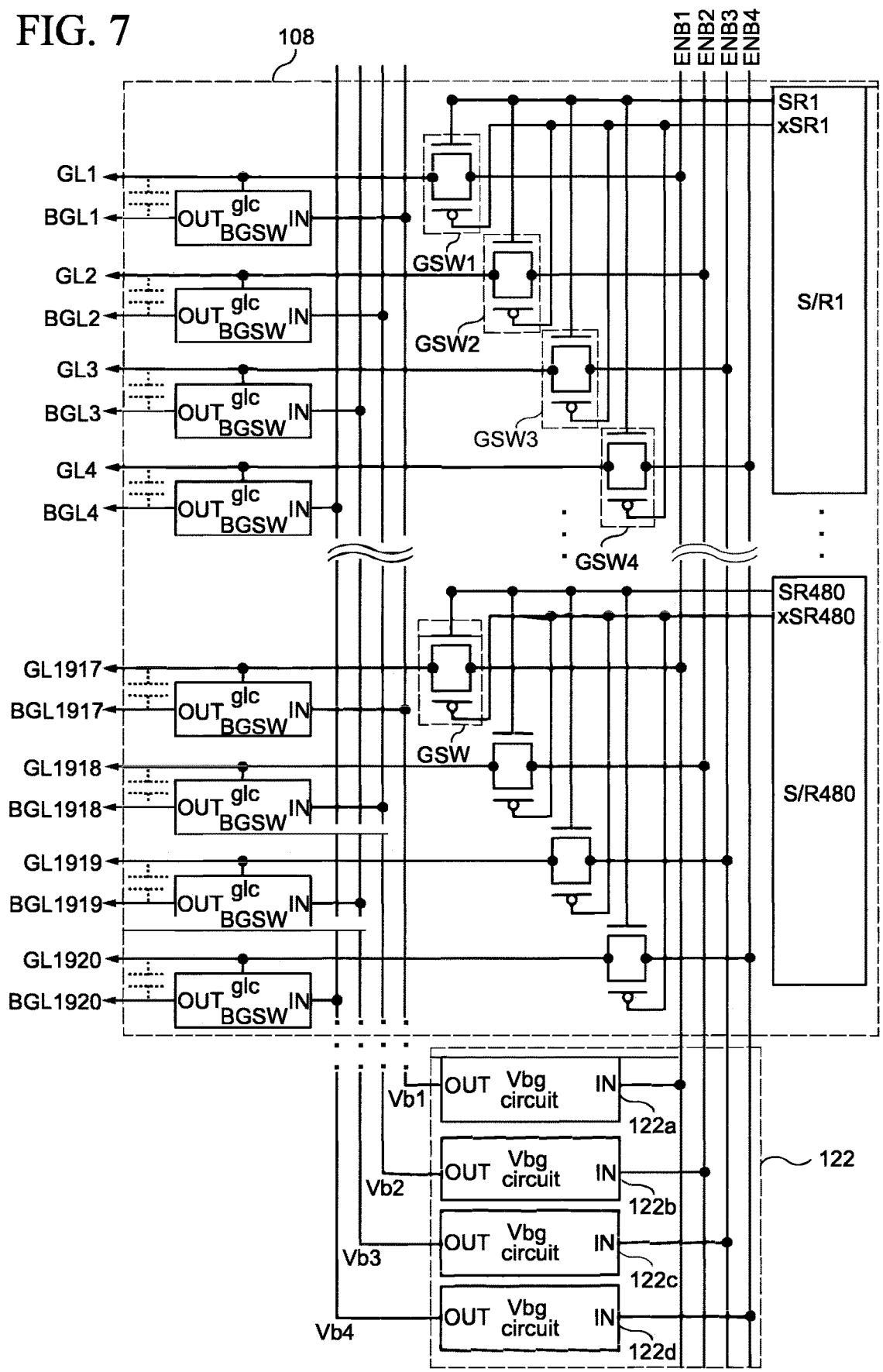
FIG. 7 is a circuit diagram showing a configuration of a gate switch and a back gate switch in detail.
Figure 8:
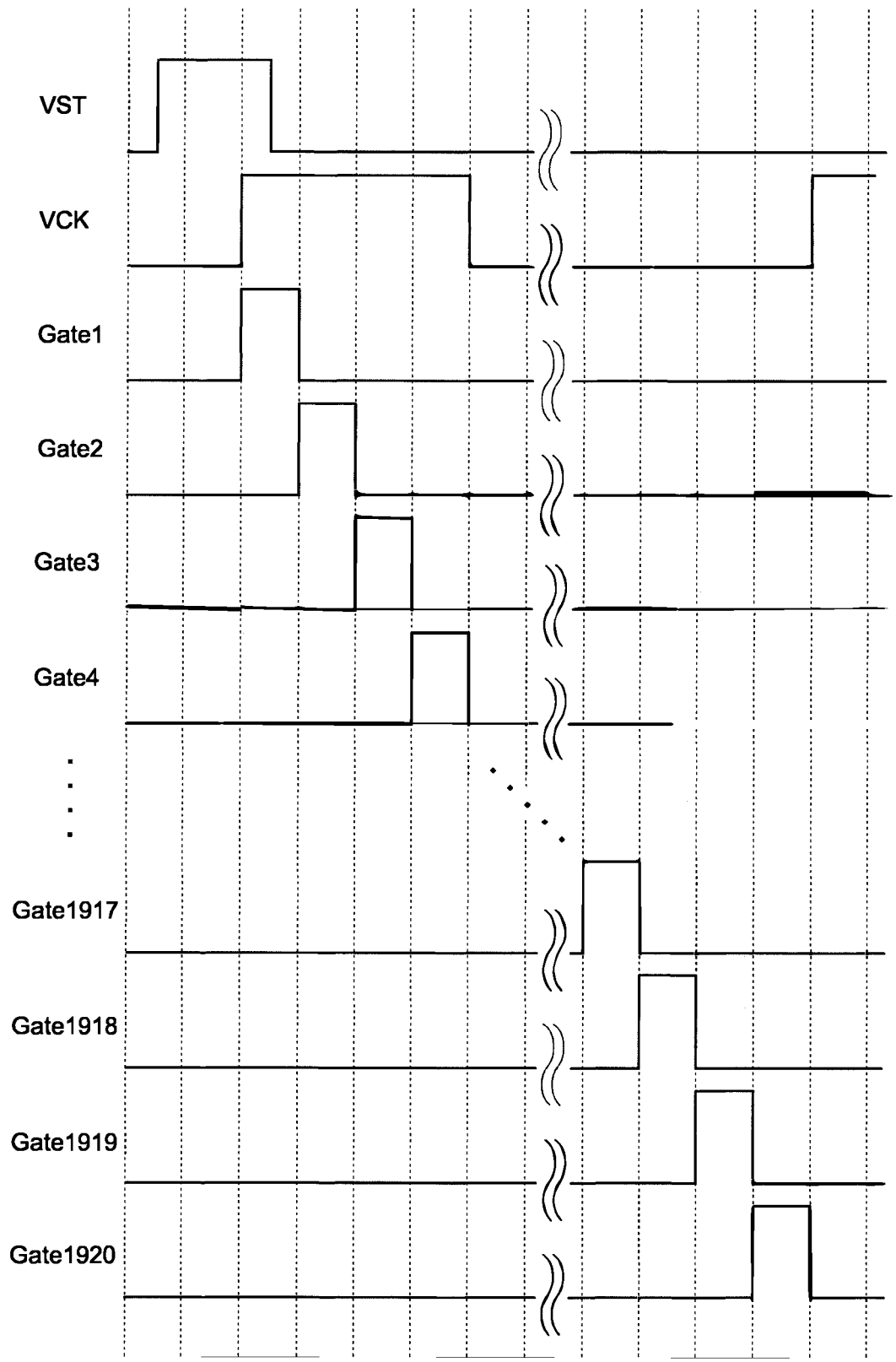
FIG. 8 is a timing chart of a gate voltage output to each gate line.

FIG. 7 is a circuit diagram showing a configuration of the gate switch (GSW) and the back gate switch (BGSW) in detail. Each gate switch (GSW) is provided corresponding to the gate line GL. Each gate switch (GSW) may be an analog switch with a set of p-channel type TFT and n-channel type TFT. When the gate switch (GSW) is turned on by the signal SR and the signal xSR output from the corresponding shift register S/R, the corresponding enable signal ENB among the enable signals ENB1 to ENB4 is output to the corresponding gate line GL as the gate voltage. FIG. 8 is a timing chart of the gate voltage Gate output to each gate line GL.

More specifically, for example, while all of the gate switch GSW11 to GSW14 are turned on by the signal SR1 and the signal xSR1 output from the shift register S/R1, the enable signal ENB1 to ENB4 are sequentially output to the gate line GL1 to GL4 as the gate voltage (gate signal) as FIG. 6 shows.

Figure 9A:
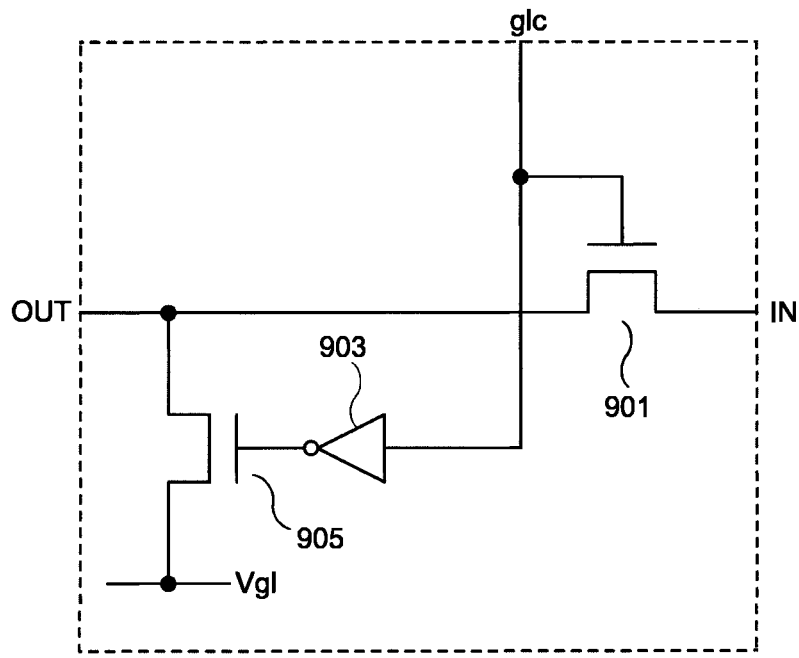
FIG. 9A is a circuit diagram showing a configuration of a back gate switch in more detail.

The back gate switch (BGSW) is provided corresponding to the back gate line BGL. The back gate switch (BGSW) is connected to the output side of the corresponding gate switch (GSW). FIG. 9A is a circuit diagram showing a configuration of the back gate switch (BGSW) in more detail. The back gate switch (BGSW) includes a through transistor 901, an inverter 903, and a Vgl transistor 905. One of the source electrode and the drain electrode of the through transistor 901 is connected to the back gate circuit 122 to be described later, the other of the source electrode and the drain electrode of the through transistor 901 is connected to an output node connected to the back gate line, and the gate electrode is connected to a signal line glc to which the output of the gate switch (GSW) shown in FIGS. 5 and 7 is supplied. The input terminal of the inverter 903 is connected to the signal line glc, and the output terminal of the inverter 903 is connected to the gate electrode of the Vgl transistor 905. One of the source electrode and the drain electrode of the Vgl transistor 905 is connected to a Vgl power supply line that supplies a potential Vgl corresponding to the low-level potential of the gate voltage. The other of the source electrode and the drain electrode of the Vgl transistor 905 is connected to the output node connected to the corresponding back gate line.

In a case where the signal supplied from the gate switch (GSW) via the signal line glc is at a low level, the potential of the output terminal OUT of the back gate switch (BGSW) is Vgl. On the other hand, in a case where the signal supplied from the gate switch (GSW) via the signal line glc is at a high level, the back gate voltage Vb supplied from the back gate circuit 122 is output from the output terminal OUT of the back gate switch (BGSW).

Figure 9B:
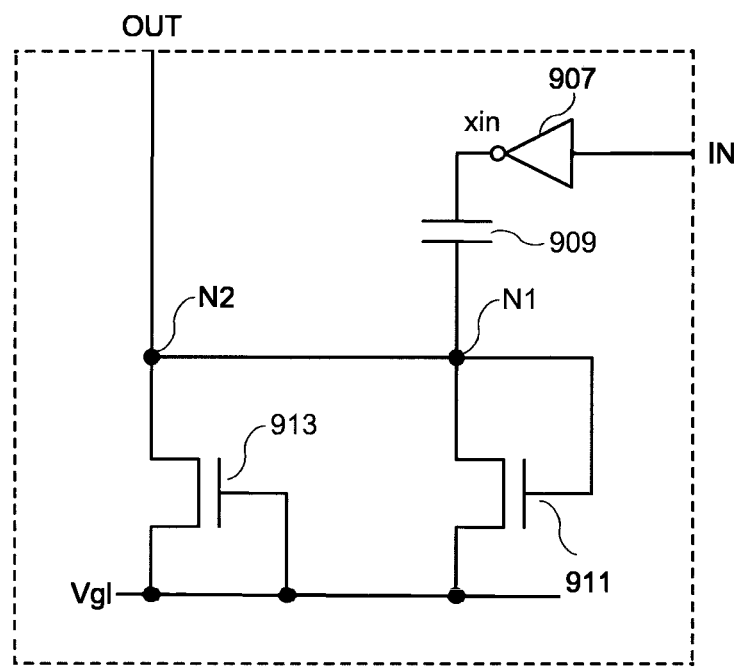
FIG. 9B is a circuit diagram showing a configuration of a back gate circuit in more detail.

FIG. 9B is a circuit diagram showing a configuration of each of the first back gate circuit 122a to the fourth back gate circuit 122d in more detail. Each of the first back gate circuits 122a to 122d includes an inverter 907, a capacitor 909, a charge transistor 911, and a voltage adjustment transistor 913. The corresponding enable signal ENB is input to the input terminal of the inverter 907. The inverted signal of the input enable signal ENB is output from the output terminal of the inverter 907. One end of the capacitor 909 is connected to the output terminal of the inverter 907, the other end is connected to a node N1 connected to the gate electrode, and one of the source electrode and the drain electrode of the charge transistor 911. The gate electrode and one of the source electrode and the drain electrode of the charge transistor 911 are electrically connected to the node N1 connected to the other end of the capacitor 909. The other of the source electrode and the drain electrode of the charge transistor 911 is connected to the Vgl power supply line and applied with the potential Vgl. One of the source electrode and the drain electrode of the voltage adjustment transistor 913 is connected to an output node N2. The gate electrode and the other of source electrode and the drain electrode of the voltage adjustment transistor 913 are connected to the Vgl power supply line and applied with the potential Vgl. The back gate voltages Vb1 to Vb4 output from the output nodes of the first back gate circuit 122a to the fourth back gate circuit 122d are applied to one of the source electrode and the drain electrode of the through transistor 901 of the corresponding back gate switch (BGSW).

Figure 10:
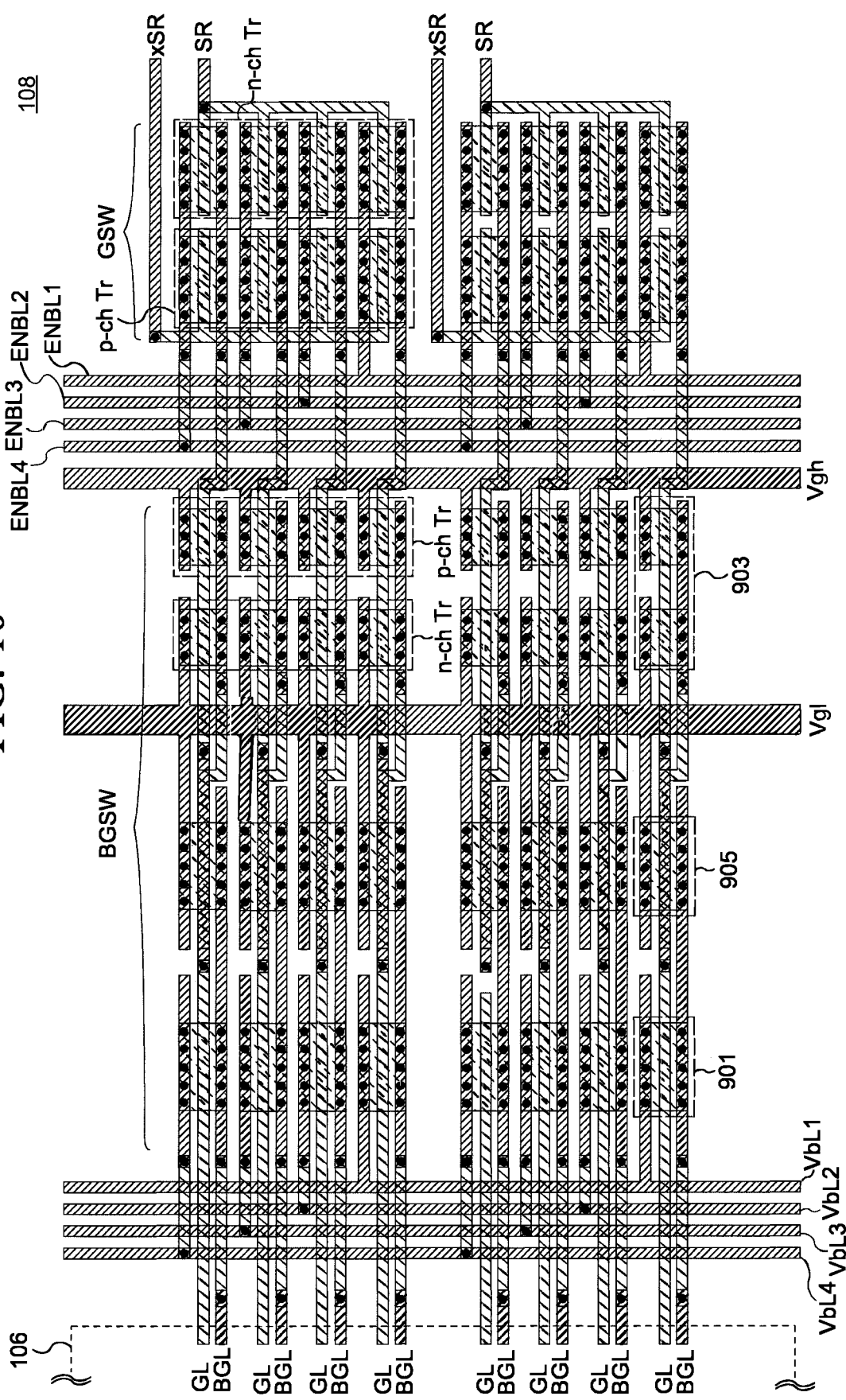
FIG. 10 is a plan view showing an example of a layout of a gate switch and a back gate switch.

FIG. 10 is a plan view showing an example of a layout of the gate switch (GSW) and the back gate switch (BGSW). In FIG. 10, Vgh is a high voltage power supply line Vgh that supplies a potential Vgh corresponding to a high-level gate voltage.

FIG. 10 shows an example of a specific layout of a part of the gate line drive circuit 108 shown on the right side of FIG. 1. More specifically, FIG. 10 shows a layout in which the gate switch (GSW) is arranged on the right side and the back gate switch (BGSW) is arranged on the left side with the enable signal lines ENBL1 to ENBL4 therebetween. With such the arrangement, the back gate switch (BGSW) is arranged between the display area 106 and the gate switch (GSW). The gate switch (GSW) is formed by an analog switch with a set of p-channel type TFT and n-channel type TFT. The gate electrode of the n-channel TFT of the gate switch (GSW) is connected to a signal line which transmits the selection signal SR output from the corresponding shift register S/R. The gate electrode of the p-channel TFT of the gate switch (GSW) is connected to a signal line which transmits the inversion selection signal xSR output from the corresponding shift register S/R. The gate electrode of the n-channel TFT and the gate electrode of the p-channel TFT are formed in a comb-like pattern, respectively. The analog switch formed by the p-channel type TFT and the n-channel type TFT is provided corresponding to a set of the gate lines GL and the back gate line BGL. The input side of the gate switch (GSW) (one of the source electrode and the drain electrode of each of the p-channel type TFT and the n-channel type TFT) is connected to one of the enable signal lines ENBL1 to ENBL4, the output side (the other of the source electrode and the drain electrode of each of the p-channel type TFT and the n-channel type TFT) is connected to the inverter (the inverter 903) of the back gate switch (BGSW). In the present embodiment, the p-channel type TFT and the n-channel type TFT are bottom-gate type transistors, respectively. Since the pattern of the gate electrode of each of the p-channel TFT and the n-channel TFT and the signal lines transmitting the signal SR/signal xSR are formed in different layers across the insulating layer, the p-channel TFT and the n-channel TFT are electrically connected to the signal lines through a contact hole.

For the back gate switch (BGSW), the inverter 903, the Vgl transistor 905, and the through transistor 901 are arranged in this order from the gate switch (GSW) side toward the gate line GL and the back gate line BGL side.

The inverter 903 of the back gate switch (BGSW) is composed of a pair of p-channel type TFT and n-channel type TFT. The gate electrode (the input terminal of the inverter 903) of each of the p-channel TFT and the n-channel TFT constituting the inverter 903 is formed by extending the output signal line of the gate switch (GSW) as it is.

The inverter 903 has the p-channel type TFT connected to the high voltage power supply line Vgh and the n-channel type TFT connected to the low voltage power supply line Vgl. The output signal line of the inverter 903 is connected to the gate electrode of the Vgl transistor 905 formed by a bottom-gate type TFT. The output signal line is formed by a conductive layer forming the gate electrode of the Vgl transistor 905 and is arranged to intersect the low voltage power supply line Vgl. The input of the Vgl transistor 905 (one of the source electrode and the drain electrode) is electrically connected to the Vgl power supply line. The output of the Vgl transistor 905 (the other of the source electrode and the drain electrode) is electrically connected to the corresponding back gate line BGL.

The gate electrode of the through transistor 901 of the back gate switch (BGSW) is connected to the input terminal of the corresponding inverter 903, i.e., the gate electrode of each of the p-channel type TFT and the n-channel type TFT. The input (one of the source electrode and the drain electrode) of the through transistor 901 is connected to any of back gate voltage supply lines VbL1 to VbL4 transmitting the back gate voltages Vb1 to Vb4, and the output (the other of the source electrode and the drain electrode) is electrically connected to the back gate line BGL. The through transistor 901 and the Vgl transistor 905 may be arranged adjacent to each other, and the other of the source electrode and the drain electrode of the through transistor 901 and the other of the source electrode and the drain electrode of the Vgl transistor 905 may be common. The through transistor 901 may also be arranged adjacent to the back gate voltage supply line.

Figure 11:
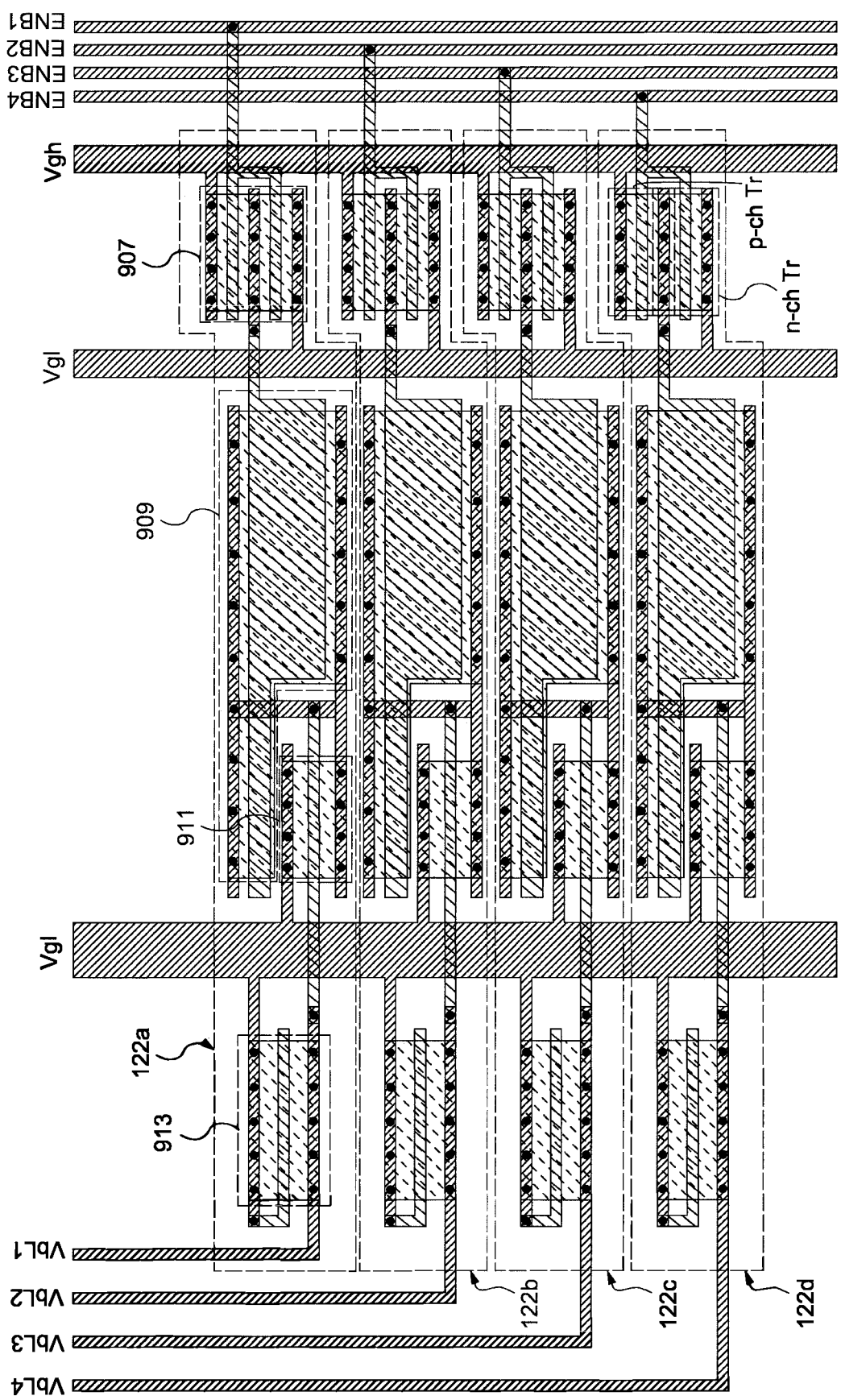
FIG. 11 is a plan view showing an example of a layout of a back gate circuit.

FIG. 11 is a plan view showing an example of a layout of the back gate circuit 122 shown on the right side of FIG. 1. FIG. 11 shows the first back gate circuit 122a to the fourth back gate circuit 122d. Since the first back gate circuit 122a to the fourth back gate circuit 122d have the same configuration, the first back gate circuit 122a will be described here with reference to FIG. 11.

The first back gate circuit 122a arranges the inverter 907, the capacitor 909, the charge transistor 911, and the voltage adjustment transistor 913 in this order from the enable signal lines ENBL1 to ENBL4 side toward the back gate voltage supply lines VbL1 to VbL4 side.

The inverter 907 is composed of a pair of p-channel type TFT and n-channel type TFT. The gate electrode (the input terminal of the inverter 907) of each of the p-channel TFT and the n-channel TFT constituting the inverter 907 is connected to any of the enable signal lines ENBL1 to ENBL4. The gate electrode of each of the p-channel TFT and the n-channel TFT constituting the inverter 907 of the first back gate circuit 122a is connected to the enable signal line ENBL1. The inverter 907 has the p-channel type TFT connected to the high voltage power supply line Vgh and the n-channel type TFT connected to the low voltage power supply line Vgl. The output signal line of the inverter 907 is connected to one of the electrodes constituting the capacitor 909.

One electrode constituting the capacitor 909 is connected to the output signal line of the inverter 907. The other electrode constituting the capacitor 909 is extended along the longitudinal direction of the one electrode of the capacitor 909 and arranged to sandwich the one electrode. The other electrode of the capacitor 909 is connected to the output signal line of the capacitor 909.

The charge transistor 911 is arranged adjacent to the capacitor 909. The output signal line of the capacitor 909 is extended and connected to the gate electrode of the charge transistor 911. The input of the charge transistor 911 (one of the source electrode and the drain electrode) is electrically connected to the Vgl power supply line. The other extended electrode constituting the capacitor 909 also serves as the output (the other of the source electrode and the drain electrode) of the charge transistor 911.

The input (one of the source electrode and the drain electrode) and the gate electrode of the voltage adjustment transistor 913 are electrically connected to the Vgl power supply line. Specifically, the gate electrode of the voltage adjustment transistor 913 is electrically connected to the Vgl power supply line by being connected to the input (one of the source electrode and the drain electrode) of the voltage adjustment transistor 913 connected to the Vgl power supply line via the contact hole. The output of the voltage adjustment transistor 913 (the other of the source electrode and the drain electrode) is electrically connected to the output signal line of the capacitor 909. The output of the voltage adjustment transistor 913 (the other of the source electrode and the drain electrode) is formed by extending the back gate voltage supply line VbL1 as it is which transmits the back gate voltage Vb.

As shown in FIG. 11, the inverter 907 is arranged between a Vgh power supply line and the Vgl power supply line. Further, the capacitor 909 and the charge transistor 911 are arranged between the Vgl power supply line and another the Vgl power supply line. One electrode of the capacitor 909 (one end of the capacitor) can be formed in the same process as the process of forming the gate electrodes of the p-channel TFT and the n-channel TFT constituting the inverter 907, the gate electrode of the charge transistor 911, and the gate electrode of the voltage adjustment transistor 913. The channel width of the voltage adjustment transistor 913 is preferably larger than the channel width of other transistors constituting the first back gate circuit 122a. This is because, as will be described later, the voltage adjustment transistor 913 discharges from a low negative potential to a predetermined potential during one horizontal period (1H). The size relation of the channel widths of the transistor constituting the first back gate circuit 122a may be as follows: the voltage adjustment transistor 913>the charge transistor 911≥the inverter 907.

Figure 12:
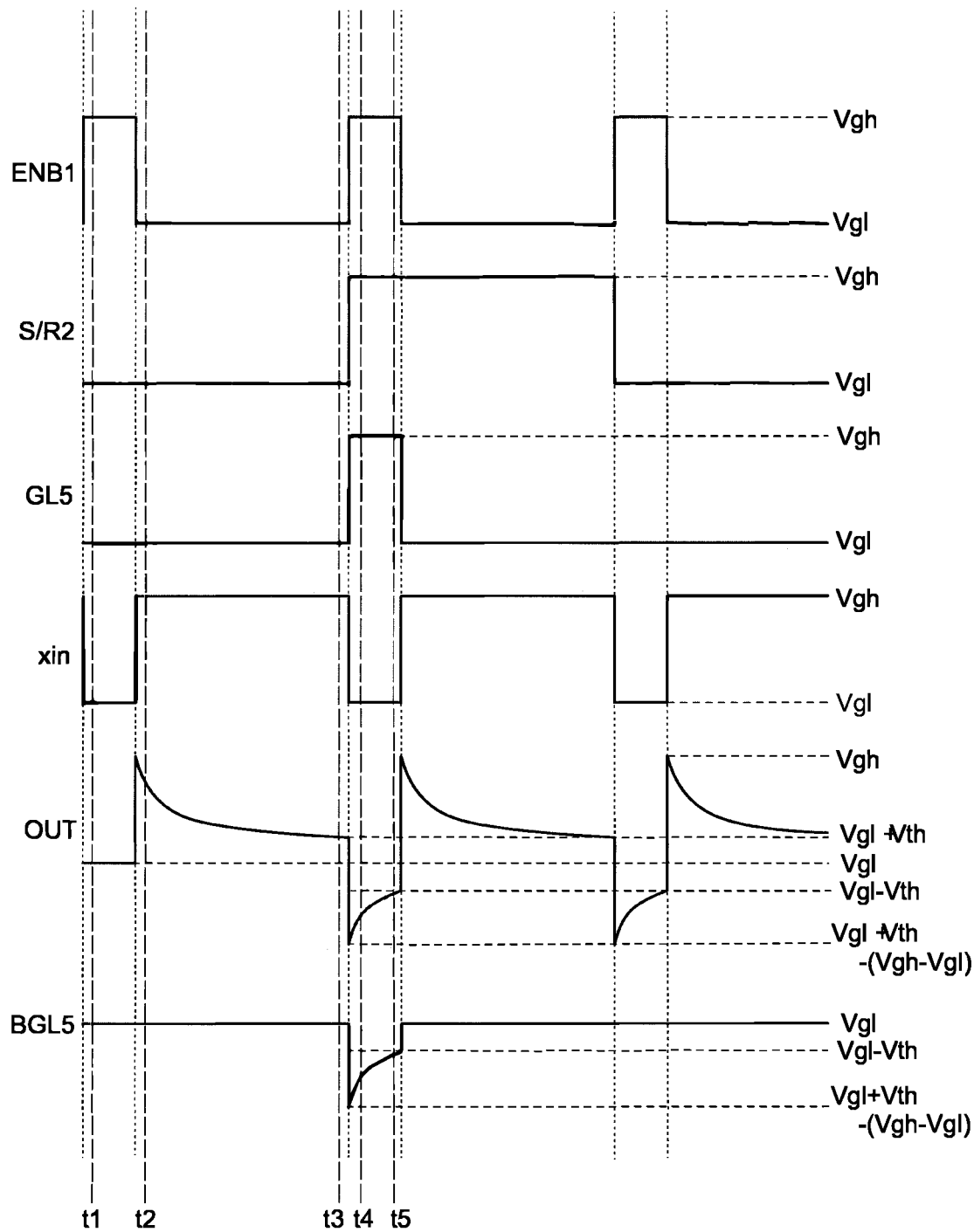
FIG. 12 is a timing chart of a gate voltage and a back gate voltage.

FIG. 12 is a timing chart of the gate voltage applied to the gate line GL5 and the back gate voltage applied to the back gate line BGL5 corresponding to the gate line GL5. FIGS. 13A to 13E are equivalent circuit diagrams for explaining the behavior of the back gate circuit 122 in the timing t1, t2, t3, t4, t5 in FIG. 12. Referring to FIG. 12 and FIGS. 13A to 13E, a back gate voltage generated by the back gate circuit 122 will be described.

Figure 13A:
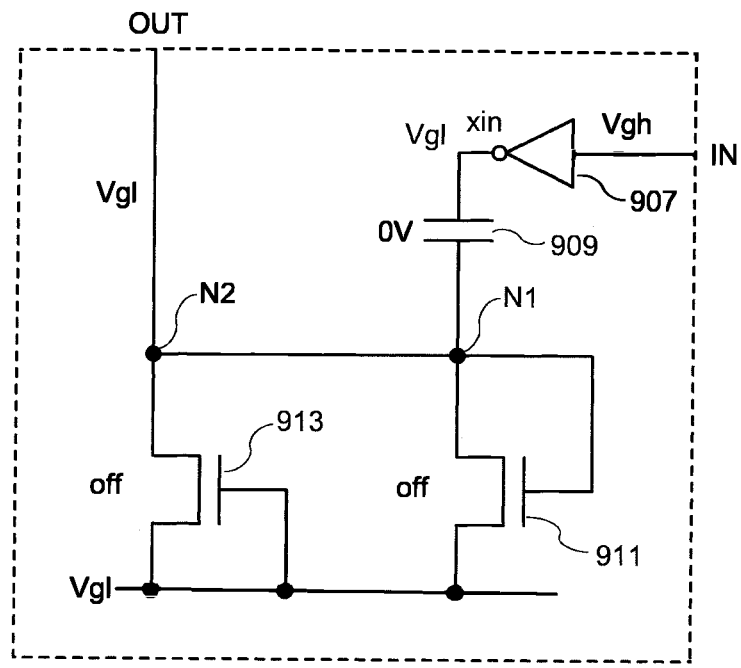
FIG. 13A is an equivalent circuit diagram for explaining the state of the back gate circuit at timing t1 in FIG. 12.

FIG. 13A is an equivalent circuit diagram showing the state of the first back gate circuit 122a at timing t1 in FIG. 12. The timing t1 corresponds to a timing immediately after the high-level enable signal ENB1 is applied to the shift register S/R1 of the first stage. As shown in FIG. 13A, at the timing t1, the enable signal ENB1 of high level (Vgh) is applied to the input terminal of the inverter 907, and an inverted signal xin of low level (Vgl) is output from the output terminal. The potential of the node N1 is Vgl and the charge transistor 911 is in the off state. Further, since the potential of the node N2 connected to one of the source electrode and the drain electrode of the voltage adjustment transistor 913 is Vgl, the voltage adjustment transistor 913 is also in the off state. Further, the capacitor 909 remains at 0V. The potential of the output node of the first back gate circuit 122a is Vgl.

Figure 13B:
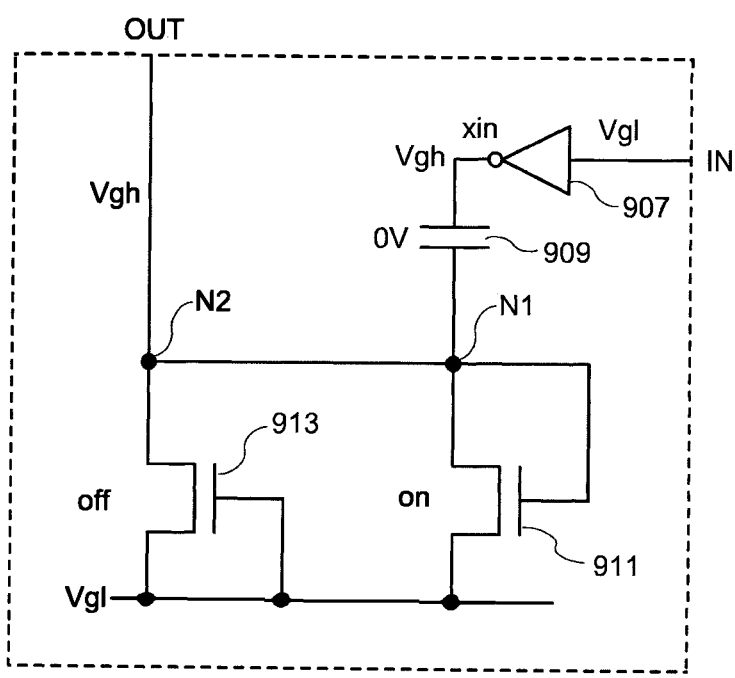
FIG. 13B is an equivalent circuit diagram for explaining the state of the back gate circuit at timing t2 in FIG. 12.

FIG. 13B is an equivalent circuit diagram showing the state of the first back gate circuit 122a at time t2 in FIG. 12. The timing t2 corresponds to a timing immediately after the enable signal ENB1 applied to the shift register S/R1 becomes low level. As shown in FIG. 13B, at the timing t2, the enable signal ENB1 which has been input to the input terminal of the inverter 907 becomes low level (Vgh), and the inverted signal xin of high level (Vgh) is output from the output terminal. The potential of the node N1 becomes Vgh, the charge transistor 911 is turned on, and charging of the capacitor 909 is started. The voltage adjustment transistor 913 remains off. As a result, at the timing t2, the potential of the output node of the first back gate circuit 122a is Vgh.

Figure 13C:
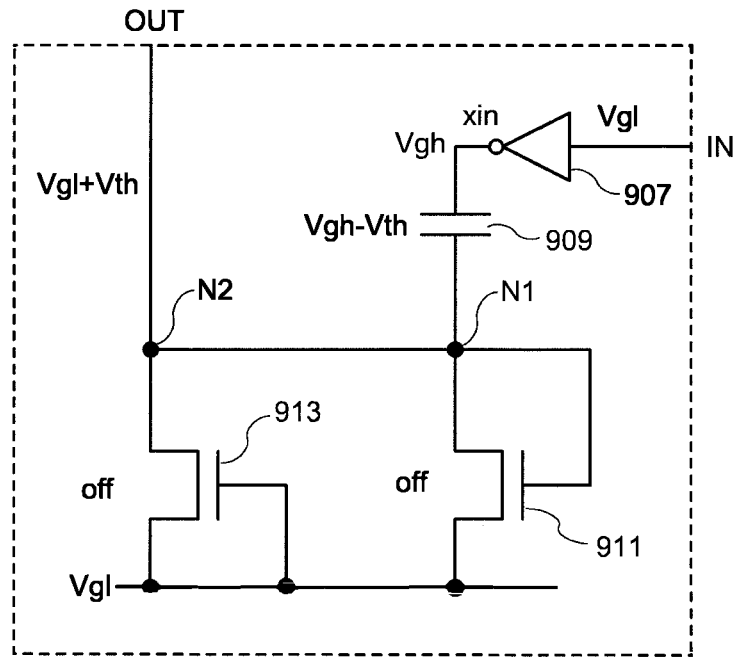
FIG. 13C is an equivalent circuit diagram for explaining the status of the back gate circuit at timing t3 in FIG. 12.

FIG. 13C is an equivalent circuit diagram showing the state of the first back gate circuit 122a at time t3 in FIG. 12. The timing t3 corresponds to a timing immediately before the start of the drive period of the shift register S/R2 of the second stage. As shown in FIG. 13C, at the timing t3, the charged capacitor 909 is charged to the voltage of Vgh-Vth. Because the potential of node N1 is reduced, the charge transistor 911 is turned off. At the timing t3, the potential of the output node of the first back gate circuit 122a is Vgl+Vth.

Figure 13D:
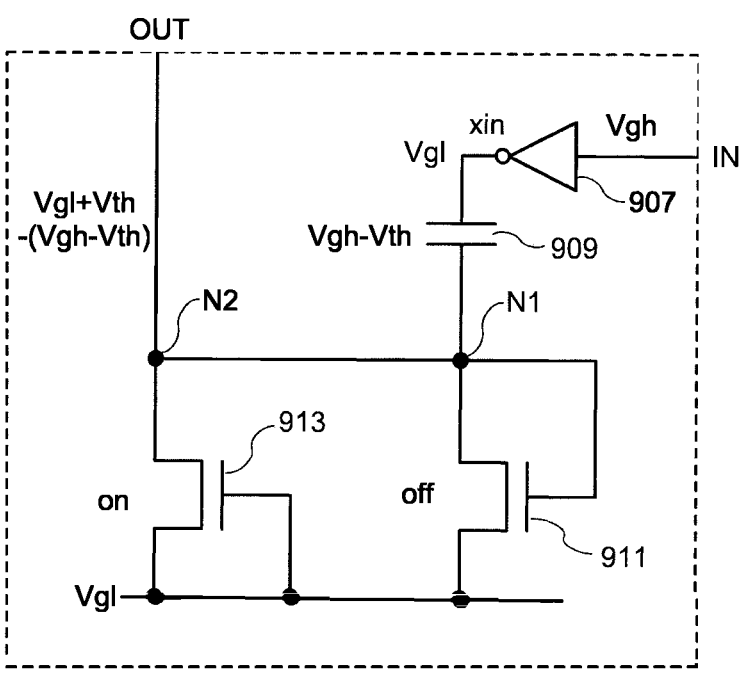
FIG. 13D is an equivalent circuit diagram for explaining the state of the back gate circuit at timing t4 in FIG. 12.

FIG. 13D is an equivalent circuit diagram showing the state of the first back gate circuit 122a at timing t4 in FIG. 12. The timing t4 corresponds to a timing immediately after the high-level enable signal ENB1 is applied to the shift register S/R2. As shown in FIG. 13D, at the timing t4, the enable signal ENB1 of high level (Vgh) is applied to the input terminal of the inverter 907, the inverted signal xin of low level (Vgl) is output from the output terminal, the potential of the node N2 is lowered, and the voltage adjustment transistor 913 is turned on. The potential of the output node of the first back gate circuit 122a is Vgl+Vth−(Vgh−Vgl). Further, the discharge of the capacitor 909 is started.

Figure 13E:
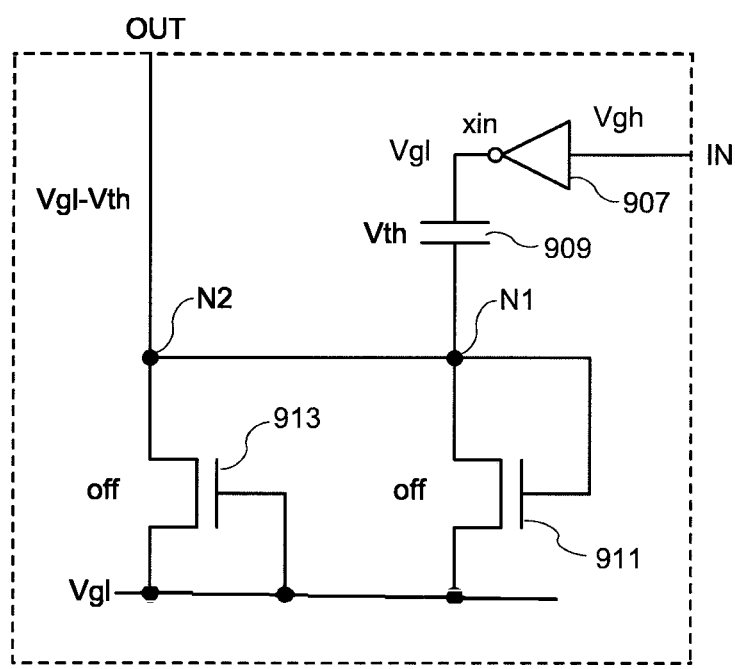
FIG. 13E is an equivalent circuit diagram for explaining the state of the back gate circuit at timing t5 in FIG. 12.

FIG. 13E is an equivalent circuit diagram showing the state of the first back gate circuit 122a at time t5 in FIG. 12. The timing t5 corresponds to a timing immediately before the enable signal ENB1 applied to the shift register S/R2 becomes low level. As shown in FIG. 13E, at the timing t5, the voltage of the capacitor 909 is Vth. The potential of the output node of the first back gate circuit 122a is Vgl-Vth, and the voltage adjustment transistor 913 is turned off.

In the back gate switch (BGSW) corresponding to the back gate line BGL5, in a case where the gate voltage applied to the gate line GL5, i.e., the enable signal ENB1, is at a low level (Vgl), Vgl is supplied to the output node of the back gate switch (BGSW) from the Vgl power supply line via the Vgl transistor. Therefore, the potential of the back gate voltage Vbg applied to the back gate line BGL5 is Vgl when the enable signal ENB1 is at a low level (Vgl). In a case where the gate voltage Vg applied to the gate line GL5 is at a high level (Vgh), the back gate voltage Vbg output from the output node of the first back gate circuit 122a is supplied via the through transistor 901 of the back gate switch BGSW and output to the back gate line BGL5.

Figure 14:
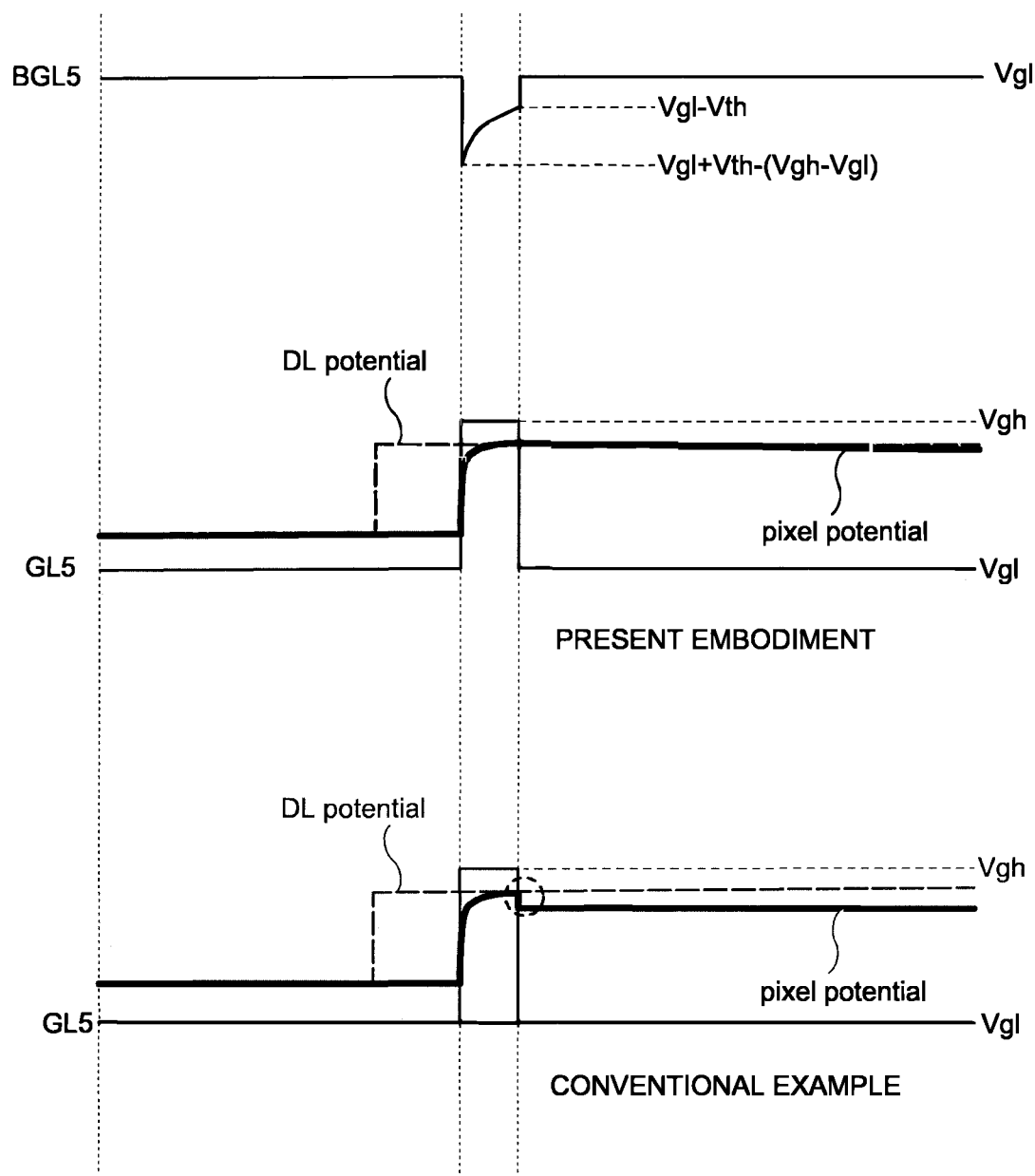
FIG. 14 is a diagram for explaining a change in the potential of an image signal when a back gate voltage is applied and a change in the potential of an image signal when a back gate voltage is not applied.

FIG. 14 is a diagram for explaining a change in the potential of an image signal when the back gate voltage (Vbg) in the present embodiment is applied (the present embodiment), and a change when the back gate voltage (Vbg) is not applied (the conventional example).

Referring to FIG. 14, in a case where the back gate voltage (Vbg) is not applied (conventional example), at the timing when the gate voltage Vg applied to the gate line GL drops to the low level, the so-called feedthrough, which the pixel potential drops slightly due to the parasitic capacitance between the gate electrode 407 and the source electrode or the drain electrode 411 (the electrode of the pixel electrode side) of the transistor in the pixel 104, occurs. Here, the pixel potential corresponds to the potential of the node Tp in FIG. 2. The feedthrough results in a flicker phenomenon and degrades the display. On the other hand, in a case where the back gate voltage (Vbg) is applied (the present embodiment), the feedthrough can be canceled by changing the back gate voltage (Vbg) applied to the back gate line BGL (the light shielding layer 403) from a lower potential than the low-level gate voltage (Vgl) to the same potential as the low-level gate voltage (Vgl). As a result, flickers of the display image can be prevented, and the display quality can be improved.

Further, with such a configuration, it is possible to maintain the potential of the common voltage Vcom applied to the common electrode 205 at a fixed potential such as GND potential. Furthermore, in the present embodiment, since the light shielding layer 403 arranged under the gate electrode 407 also serves as the back gate line BGL, the opening ratio of the pixel 104 is not reduced, it is possible to increase the resolution of the display device.

In this embodiment, each shift register S/R selects one enable signal ENB from the four enable signals ENB1 to ENB4 and sequentially supplied to the corresponding gate switch (GSW). However, the number of the enable signals ENB is not limited to four and may be one or more. The shift register S/R may be provided corresponding to each gate line GL when the enable signal ENB is one. When there are two or more enable signals ENB, each shift register S/R may select one enable signal ENB and sequentially supplied to the corresponding gate switch GSW, as in the present embodiment.

<Modifications>

In the present embodiment has been described the configuration of the back gate switch (BGSW) with reference to FIG. 7 and FIG. 9A, the configuration of the back gate switch (BGSW) is not limited thereto.

Figure 15:
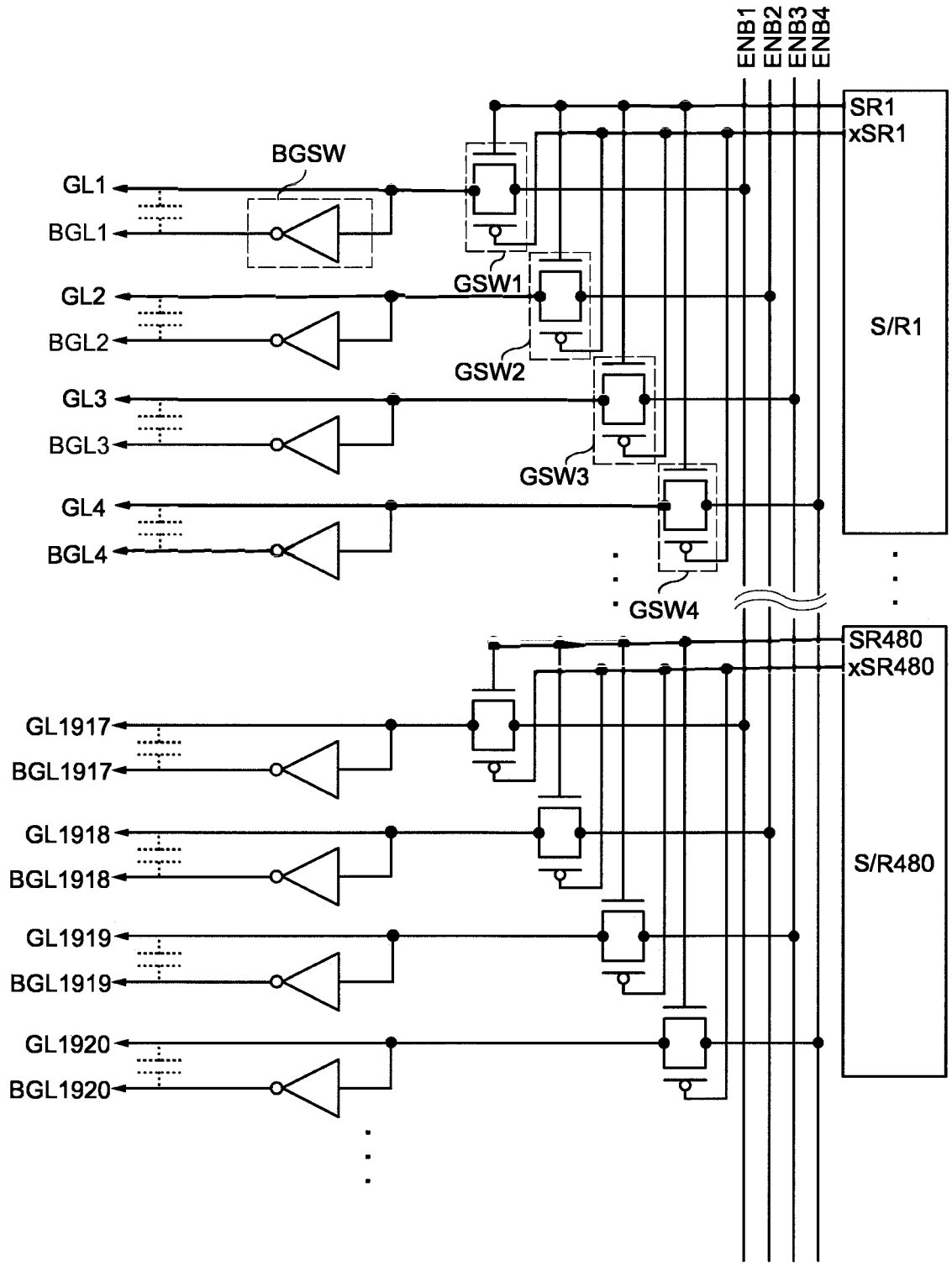
FIG. 15 is a circuit diagram showing another example of a configuration of a gate switch and a back gate switch.

FIG. 15 is a circuit diagram showing another example of a configuration of the gate switch (GSW) and the back gate switch (BGSW). In FIG. 15, the configuration of the gate switch (GSW) is the same as the configuration of the gate switch (GSW) shown in FIG. 7. On the other hand, the configuration of the back gate switch (BGSW) differs from the configuration of the back gate switch (BGSW) shown in FIG. 7 and FIG. 9A. Specifically, as shown in FIG. 15, the back gate switch (BGSW) can also be configured with inverters. In such a configuration, a voltage obtained by simply inverting the gate voltage output from the gate switch (GSW) to the gate line GL is supplied to the back gate line BGL. Also in this case, as in the first embodiment described above, the feedthrough can be canceled. Further, in the circuit example shown in FIG. 15, the back gate circuit 122 can be omitted, the layout flexibility of the display device 100 can be increased.

Further, in the pixel 104, in order to appropriately form a parasitic capacitance between the back gate line BGL (the light shielding layer 403) and the conductive layer 415 (one of the source electrode and the drain electrode of the TFT, which is the switching element 201), it is preferable to widen the area where the conductive layer 415 and the back gate line BGL (the light shielding layer 403) are overlapped.

Figure 16A:
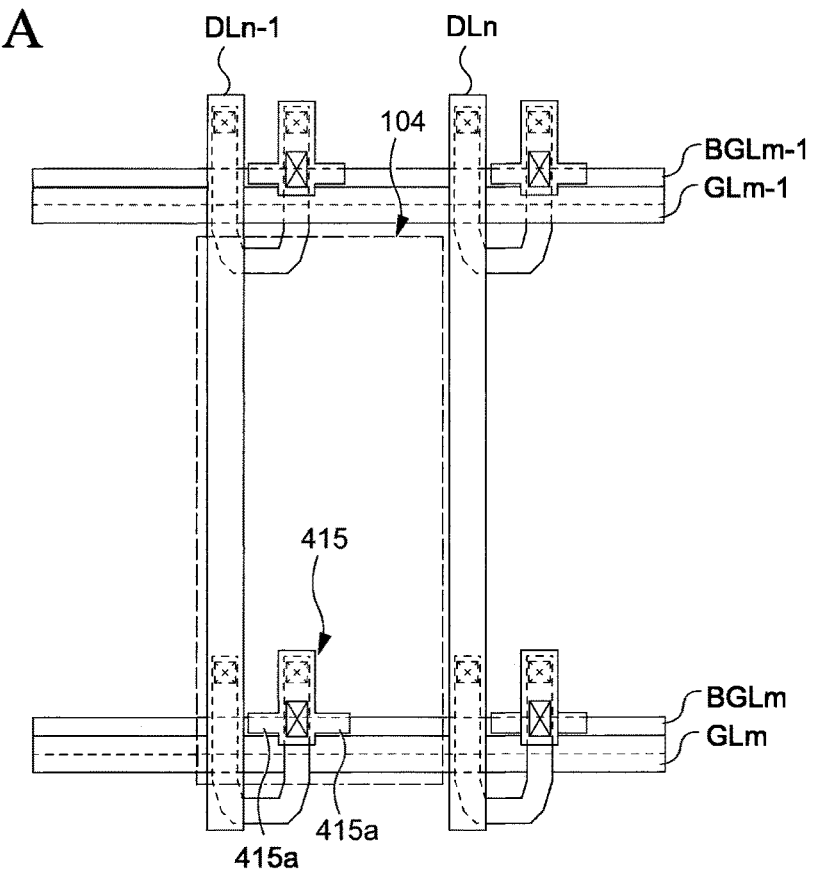
FIG. 16A is a plan view showing another example of a pixel layout.
Figure 16B:
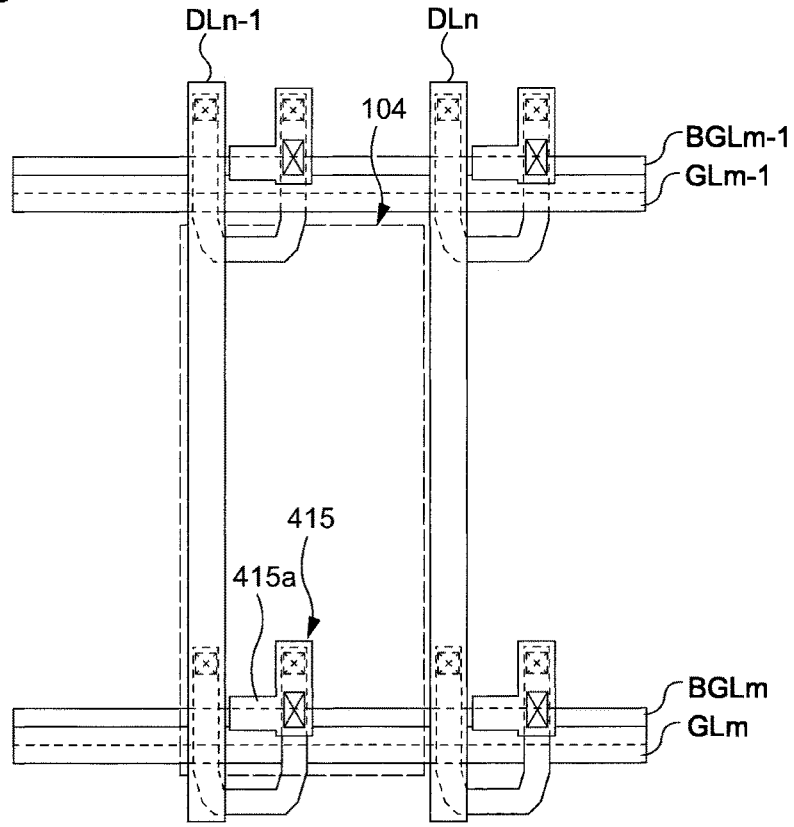
FIG. 16B is a plan view showing another example of a pixel layout.

FIG. 16A and FIG. 16B are plan views showing another example of a layout of the pixel 104. In FIGS. 16A and 16B, the conductive layer 415, which is one of the source and drain electrodes of the switching element 201 and the electrode that connects to the pixel electrode, includes an extension part 415*a* extending parallel to the direction in which the back gate line BGL is extended so as to overlap the back gate line BGL. Thus, it is possible to widen the area where the conductive layer 415 and the back gate line BGL are overlapped, and the capacitance between the back gate line BGL and the conductive layer 415 can be adjusted. As shown in FIG. 16A, the conductive layer 415 may include the extension part 415*a* that is extended in both directions parallel to the direction in which the back gate line BGL is extended. As shown in FIG. 16B, the conductive layer 415 may include the extension part 415*a* that is extended in one direction parallel to the direction in which the back gate line BGL is extended.

In the embodiment described above, the case where the display device is a liquid crystal display device has been described. However, the display device according to the present embodiment is not limited to a liquid crystal display device.

Second Embodiment

A configuration of a display device according to another embodiment of the present invention will be described. the case where the display device according to an embodiment of the present invention is an organic EL display device will be described.

Figure 17:
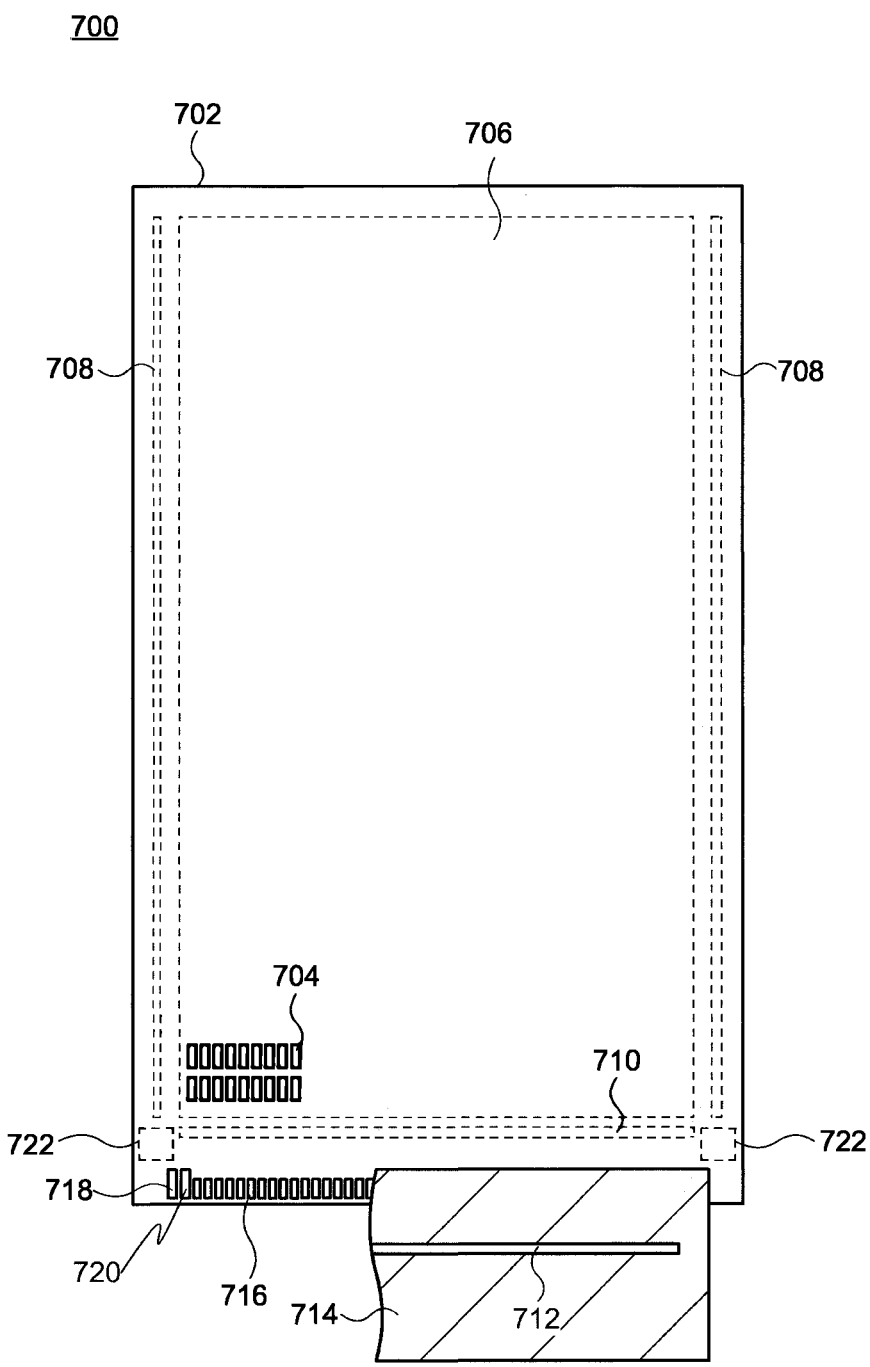
FIG. 17 is a schematic view showing an example of a configuration of a display device according to another embodiment.

FIG. 17 is a schematic view showing an example of a configuration of a display device 700 according to the second embodiment. The display device 700 has a substrate 702 and has various insulating layer, semiconductor layer, and conductive layer patterned thereon. These insulating layer, semiconductor layer, and conductive layer provide a plurality of pixels 704 and a drive circuit for driving the pixel 704. The drive circuit includes a gate line drive circuit 708, a data line drive circuit 710, and a back gate voltage generation circuit (back gate circuit) 722. The plurality of pixels 704 is arranged periodically, by which a display area 706 is defined. An organic electroluminescence element (organic EL element) 760 is provided for each pixel 704.

The gate line drive circuit 708, the data line drive circuit 710, and the back gate circuit 722 are arranged in a peripheral area surrounding the display area 706. Various wiring (not shown) formed of a patterned conductive film extend from the display area 706, the gate line drive circuit 708, the data line drive circuit 710, and the back gate circuit 722 to one side of the substrate 702. These wirings are exposed near the end of the substrate 702 to form terminals such as signal terminals 716, power supply terminals 718, 720, and the like. These terminals are electrically connected to a flexible printed circuit board (FPC) 714.

In the present embodiment, a drive IC 712 having an integrated circuit formed on a semiconductor substrate is mounted on the FPC 714. Various signals required for driving the pixel 704 such as an image signal, a clock signal, and the like are supplied from an external circuit (not shown)

via the drive IC 712 and the FPC 714. These signals are supplied to the gate line drive circuit 708, the data line drive circuit 710, and the back gate circuit 722 via the signal terminals 716.

<Pixel Configuration>

Figure 18:
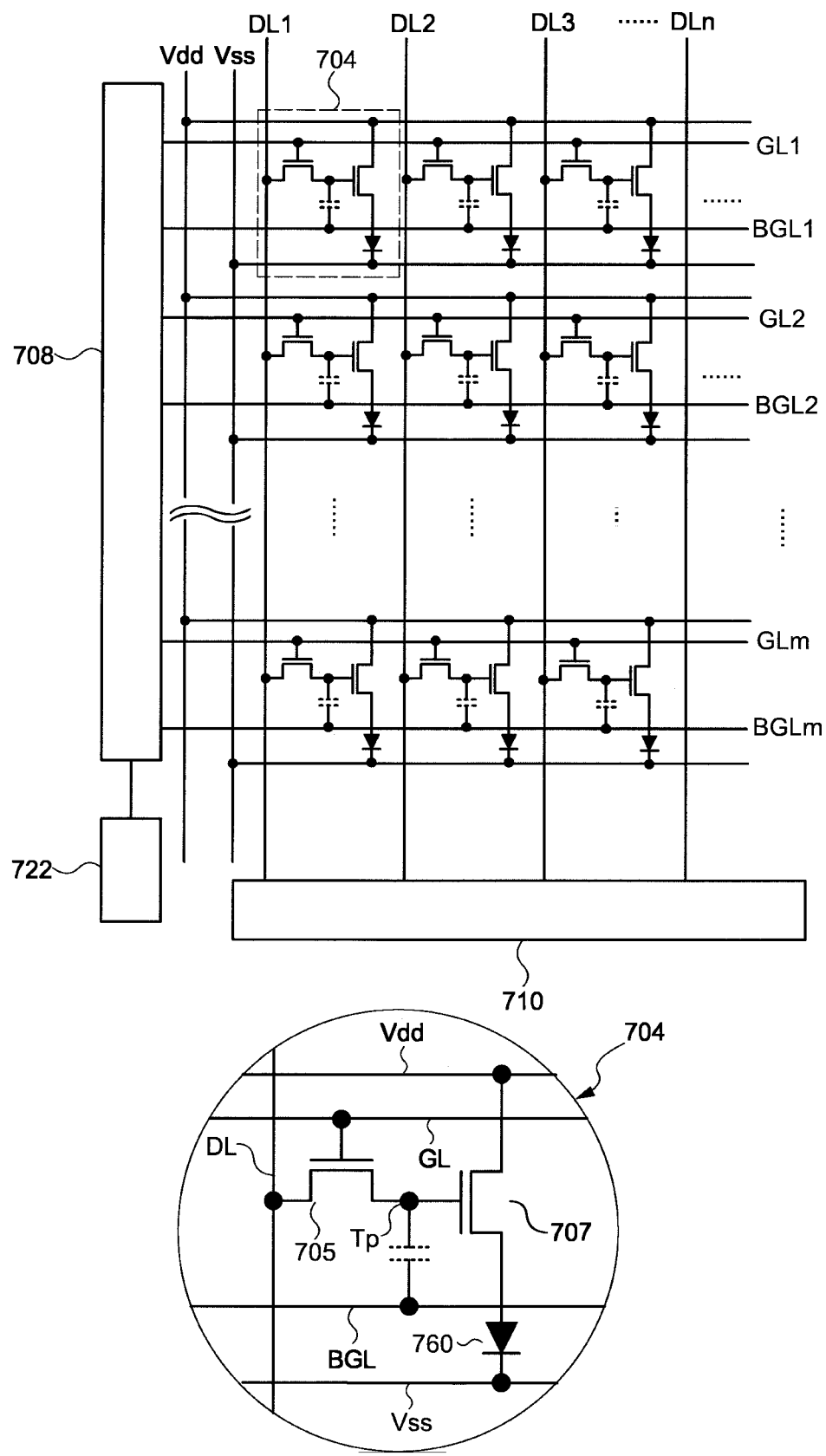
FIG. 18 is a schematic view showing an equivalent circuit of a pixel of a display device and an enlarged view of the equivalent circuit of the pixel.

A configuration of the pixel 704 will be described with reference to FIG. 18. FIG. 18 is a schematic view showing an equivalent circuit of the pixel 704 and an enlarged view of the pixel 704. The pixel 704 includes a select transistor 705, a drive transistor 707 and the organic EL element 760.

In this embodiment, the select transistor 705 and the drive transistor 707 are thin film transistors (TFTs). A gate electrode of the select transistor 705 is connected to a gate line GL (GL1 to GLm; m is an integer of 1 or more) and a gate voltage is supplied via the gate line GL. One of the source electrode and the drain electrode of the select transistor 705 is connected to the data line DL (DL1 to DLn; n is an integer of 1 or more) to which a video signal is supplied. The other of the source electrode and the drain electrode of the select transistor 705 is electrically connected to the gate electrode of the drive transistor 707. The source electrode of the drive transistor 707 is connected to a power supply line supplying a power supply Vdd. The drain electrode of the drive transistor 707 is connected to an anode of the organic EL element 760. A back gate voltage having potential in a reverse phase of the gate voltage supplied to the gate line GL is supplied to the back gate line BGL (BGL1 to BGLm).

The circuit example of the pixel 704 described above is an example, the configuration of the pixel 704 of the display device 700 of the present embodiment is not limited to the circuit configuration shown in FIG. 18.

Figure 19:
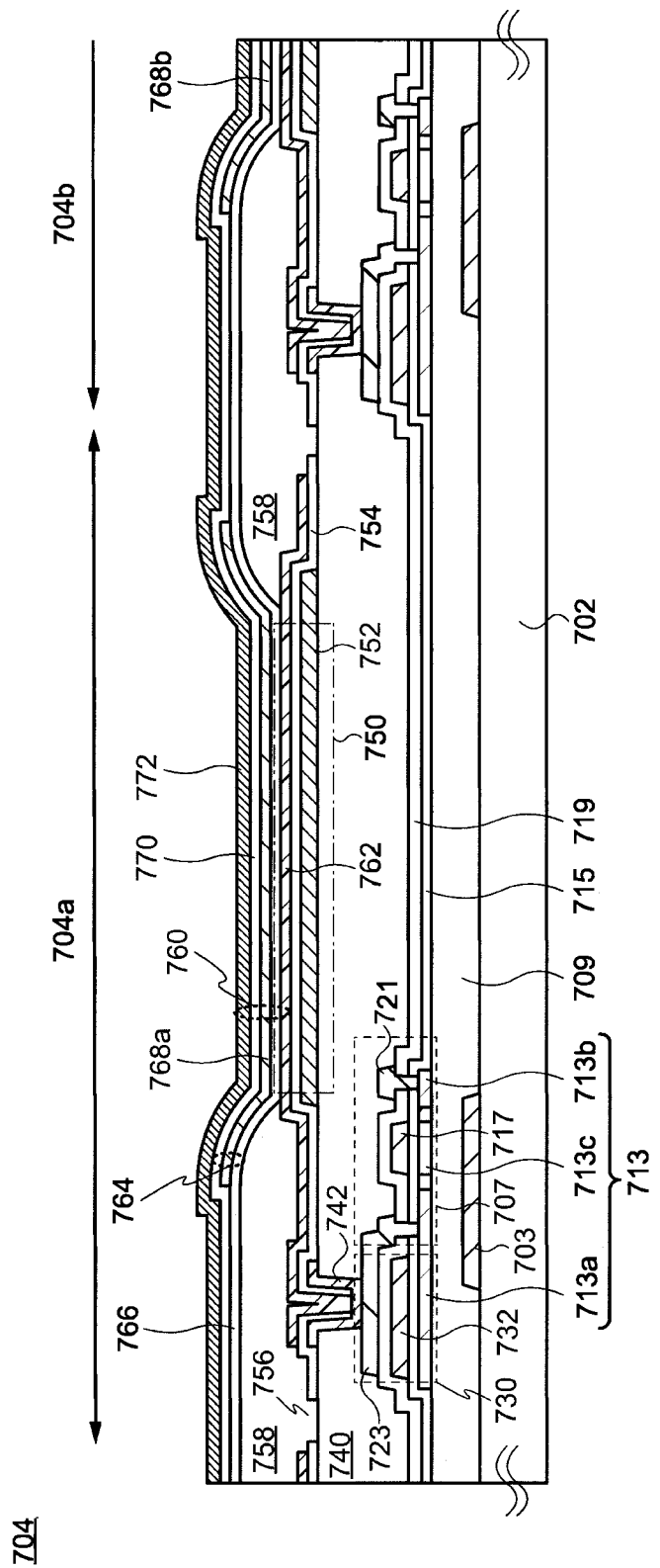
FIG. 19 is cross-sectional view of a pixel according to a display device.

FIG. 19 is a schematic cross-sectional view of two adjacent pixels 704 (704*a* and 704*b*). A pixel circuit is formed in each pixel 704. The configuration of the pixel circuit is arbitrary, and the drive transistor 707, a storage capacitor 730, an additive capacitance 750, and the organic EL element 760 are shown in FIG. 19.

The substrate 702 is an insulating substrate such as a glass substrate. A light shielding layer 703 is arranged on the substrate 702. The light shielding layer 703 also serves as the back gate line BGL. The light shielding layer 703 (the back gate line BGL) is extended parallel to the gate line GL, is provided in common to the pixels 704 of each row. The light shielding layer 703 is formed of a conductive material. The conductive materials used for the light shielding layer 703 may be a metal, and may include, for example, Cu, Al, W, Mo, or an alloy thereof.

Each element included in the pixel circuit is arranged on the substrate 702 via an undercoat layer 709 arranged on the light shielding layer 703. The drive transistor 707 includes a semiconductor layer 713, a gate insulating film 715, a gate electrode 717, a source electrode 721, and a drain electrode 723. The gate electrode 717 is arranged to intersect at least a part of the semiconductor layer 713 via the gate insulating film 715. The gate electrode 717 also serves as the gate line GL. The gate electrode 717 is arranged to overlap the light shielding layer 703. The semiconductor layer 713 has a drain area 713*a*, a source area 713*b*, and a channel 713*c*. The channel 713*c* is an area where the semiconductor layer 713 and the gate electrode 717 overlap.

A capacitance electrode 732 is present in the same layers as the gate electrode 717 and overlaps the drain area 713*a* via the gate insulating film 715. An interlayer insulating film 719 is arranged on the gate electrode 717 and the capacitance electrode 732. The interlayer insulating film 719 and the gate insulating film 715 are formed with openings reaching the source area 713*b* and the drain area 713*a*, respectively. The source electrode 721 and the drain electrode 723 are arranged inside the openings. The drain electrode 723 overlaps the capacitance electrode 732 via the interlayer insulating film 719. The storage capacitor 730 is formed by the drain area 713*a*, the capacitance electrode 732, and the gate insulating film 715 therebetween, and the capacitance electrode 732, the drain electrode 723, and the interlayer insulating layer 719 therebetween.

A planarization layer 740 is arranged on the drive transistor 707 and the storage capacitor 730. The planarization layer 740 has an opening that reaches the drain electrode 723. A connecting electrode 742 overlying the opening and a part of the top surface of the planarization layer 740 is arranged in contact with the drain electrode 723. An additive capacitance electrode 752 is arranged on the planarization layer 740. A capacitance insulating film 754 is arranged to cover the connecting electrode 742 and the additive capacitance electrode 752. The capacitance insulating film 754 exposes a part of the connecting electrode 742 at the opening of the planarization layer 740. Thus, a pixel electrode 762 of the organic EL element 760 and the drain electrode 723 are electrically connected via the connecting electrode 742. The capacitance insulating film 754 is provided with an opening 756. A bank 758 arranged on the capacitance insulating film 754 and the planarization layer 740 are contacted via the opening 756. With this configuration, impurities in the planarization layer 740 can be removed through the opening 756, thereby improving the reliability of the pixel circuit and the organic EL element 760. The formation of the connecting electrode 742 and the opening 756 is optional.

The pixel electrode 762 is arranged on the capacitance insulating film 754 to cover the connecting electrode 742 and the additive capacitance electrode 752. The capacitance insulating film 754 is arranged between the additive capacitance electrode 752 and the pixel electrode 762. This structure constitutes the additive capacitance 750. The pixel electrode 762 is shared by the additive capacitance 750 and the organic EL element 760. The bank 758 which covers the end of the pixel electrode 762 is arranged on the pixel electrode 762.

The organic EL element 760 includes the pixel electrode 762, an EL layer 764, and a counter electrode 772. The EL layer 764 and the counter electrode 772 are arranged to cover the pixel electrode 762 and the bank 758. In the example shown in FIG. 17, the EL layer 764 includes a hole injection/transportation layer 766, a light emitting layer 768 (light emitting layers 768*a*, 768*b*), and an electron injection/transportation layer 770. The hole injection/transportation layer 766 and the electron injection/transportation layer 770 are provided in common to the plurality of pixels 704 and are shared by the plurality of pixels 704. Similarly, the counter electrode 772 covers the plurality of pixels 704 and is shared by the plurality of pixels 704. On the other hand, the emitting layer 768 is provided individually for each pixel 704.

Known structures and materials can be applied to the pixel electrode 762, the counter electrode 772, and the EL layer 764. For example, the EL layer 764 may have various functional layers, such as a hole blocking layer, an electron blocking layer, and an exciton block layer, in addition to the above-described structure.

The structure of the EL layer 764 may be the same for the plurality of pixels 704, or a part of the structure may be different between the adjacent pixels 704. For example, the pixel 704 may be configured such that the structure or material of the emitting layer 768 is different between the adjacent pixels 704, and other layers have the same structure.

In the pixel 704 including the organic EL element 760, similar to the pixel in the liquid crystal display device described in the first embodiment, at the timing when the gate voltage Vg drops to the low level, a feedthrough in which the potential of a node Tp shown in FIG. 17 decreases occurs. To cancel this feedthrough, the back gate voltage Vbg in a reverse phase of the gate voltage Vg is applied to the back gate line BGL (the light shielding layer 703). As a result, flickers of the display image can be prevented, and the display quality can be improved. Since the back gate voltage Vbg is the same as the back gate voltage Vbg applied to the pixel 104 of the liquid crystal display device 100 described in the first embodiment, a detailed description thereof will be omitted in the present embodiment.

It is also within the scope of the present invention that a skilled in the art adds, deletes, or changes designs of constituent elements, or adds, omits, or changes conditions of processes based on the display device of the above-described embodiments, as long as the gist of the present invention is provided.

Even if it is other working effects which is different from the working effect brought about by the mode of each above-mentioned embodiment, what is clear from the description in this description, or what can be easily predicted by the person skilled in the art is naturally understood to be brought about by the present invention.

What is claimed is:

1. A display device comprising:
   a display unit having a display area, the display area including a plurality of pixels including semiconductors, each of the plurality of pixels includes a liquid crystal element;
   a first drive circuit supplying a gate voltage to drive the plurality of pixels;
   a gate line extended across the display area and connected to the plurality of pixels and the first drive circuit, the gate line transmitting the gate voltage to the plurality of pixels, the gate line overlapping the semiconductors;
   a second drive circuit supplying a drive voltage corresponding to a luminance of each of the plurality of pixels;
   a data line extended across the display area and connected to the plurality of pixels and the second drive circuit, the data line transmitting the drive voltage to the plurality of pixels;
   a back gate circuit generating a back gate voltage having a reverse polarity of the gate voltage; and
   a back gate line extending parallel to the gate line, the back gate line transmitting the back gate voltage to the plurality of pixels, wherein:
   the back gate line and the gate line are at least partially overlapped through a first insulating layer,
   a first area of the back gate line is overlapped with the gate line through the first insulating layer over the display area, and part of the first area of the back gate line is overlapped with the semiconductors via the gate line,
   a second area of the back gate line adjacent to the first area is not overlapped with the gate line over the display area,
   the display unit comprises an array substrate, a color filter substrate facing the array substrate, and a liquid crystal layer arranged between the array substrate and the color filter substrate,
   the array substrate comprises:
      a substrate;
      the back gate line arranged on the substrate;
      a switching element including a gate electrode partially overlapping the back gate line and connected to the gate line, a gate insulating film arranged on the gate electrode, a semiconductor layer arranged on the gate insulating film, and a conductive layer arranged on the semiconductor layer and connected to the semiconductor layer;
      a first electrode arranged overlapping the semiconductor layer and to which a predetermined voltage is applied;
      a second insulating layer arranged on the first electrode; and
      a second electrode arranged on the second insulating layer and connected to the conductive layer, and
   the color filter substrate comprises a color filter layer arranged on a surface of a side facing the array substrate.

2. The display device according to claim 1, wherein the conductive layer is at least partially overlapped with the back gate line.

3. The display device according to claim 2, wherein the conductive layer includes an extension part extending parallel to an extension direction of the back gate line.

4. The display device according to claim 1, wherein each of the plurality of pixels includes an organic electroluminescence element.

5. The display device according to claim 1, wherein the first driving circuit includes shift registers and sequentially supplies the gate voltage to one or more gate lines based on an output signal from one of the shift registers and a timing signal.

6. The display device according to claim 1, wherein a potential of the back gate voltage is lower than a potential of the gate voltage at low level.

* * * * *